(12) United States Patent
Hosono

(10) Patent No.: US 7,916,547 B2
(45) Date of Patent: Mar. 29, 2011

(54) METHOD FOR CONTROLLING A NON-VOLATILE SEMICONDUCTOR MEMORY DEVICE

(75) Inventor: Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 21 days.

(21) Appl. No.: 12/209,486

(22) Filed: Sep. 12, 2008

(65) Prior Publication Data

US 2009/0073763 A1  Mar. 19, 2009

(30) Foreign Application Priority Data

Sep. 14, 2007  (JP) ................ 2007-239089

(51) Int. Cl.
*G11C 16/06* (2006.01)
*G11C 16/04* (2006.01)

(52) U.S. Cl. ......... 365/185.21; 365/185.02; 365/185.17; 365/185.18; 365/185.22

(58) Field of Classification Search .............. 365/185.21
See application file for complete search history.

(56) References Cited

U.S. PATENT DOCUMENTS

| | | | | |
|---|---|---|---|---|
| 7,009,881 B2 * | 3/2006 | Noguchi | ................ | 365/185.17 |
| 7,180,787 B2 * | 2/2007 | Hosono et al. | ........... | 365/185.24 |
| 7,245,528 B2 | 7/2007 | Shibata et al. | | |
| 7,369,437 B2 * | 5/2008 | Kamei | ................ | 365/185.17 |
| 7,376,009 B2 | 5/2008 | Shibata et al. | | |
| 7,440,327 B1 * | 10/2008 | Sekar et al. | ............ | 365/185.18 |
| 7,508,715 B2 * | 3/2009 | Lee | ............ | 365/185.18 |
| 7,561,472 B2 * | 7/2009 | Doyle | .............. | 365/185.2 |
| 7,606,070 B2 * | 10/2009 | Mokhlesi | ............... | 365/185.17 |
| 7,606,079 B2 * | 10/2009 | Sekar et al. | ............ | 365/185.22 |
| 7,619,931 B2 * | 11/2009 | Mihnea et al. | .......... | 365/185.22 |
| 2006/0028870 A1 * | 2/2006 | Roohparvar | ............. | 365/185.17 |
| 2007/0140011 A1 * | 6/2007 | Kamei | ............... | 365/185.17 |
| 2008/0049508 A1 * | 2/2008 | Iwai et al. | ............... | 365/185.17 |
| 2009/0086542 A1 * | 4/2009 | Lee et al. | ................ | 365/185.17 |

FOREIGN PATENT DOCUMENTS

| | | |
|---|---|---|
| JP | 9-139092 | 5/1997 |
| JP | 2002-133888 | 5/2002 |
| JP | 2002-358792 | 12/2002 |
| JP | 2005-243205 | 9/2005 |
| JP | 2005-285185 | 10/2005 |
| JP | 2007-80307 | 3/2007 |
| JP | 2009-539203 | 11/2009 |
| WO | WO 2007/143398 A2 | 12/2007 |
| WO | WO 2007/143398 A3 | 12/2007 |

OTHER PUBLICATIONS

U.S. Appl. No. 12/868,196, filed Aug. 25, 2010, Fujimura.

\* cited by examiner

*Primary Examiner* — Son L Mai
(74) *Attorney, Agent, or Firm* — Oblon, Spivak, McClelland, Maier & Neustadt, L.L.P.

(57) ABSTRACT

A non-volatile semiconductor memory device has a NAND string, in which multiple memory cells are connected in series. A read procedure is performed for a selected memory cell in the NAND string on the condition that the selected memory cell is applied with a selected voltage while unselected memory cells are driven to be turned on without regard to cell data thereof. In the read procedure, a first read pass voltage is applied to unselected memory cells except an adjacent and unselected memory cell disposed adjacent to the selected memory cell, the adjacent and unselected memory cell being completed in data write later than the selected memory cell, and a second read pass voltage higher than the first read pass voltage is applied to the adjacent and unselected memory cell.

16 Claims, 23 Drawing Sheets

METHOD FOR CONTROLLING A NON-VOLATILE SEMICONDUCTOR MEMORY DEVICE

CROSS-REFERENCE TO RELATED APPLICATION

This application is based on and claims the benefit of priority from the prior Japanese Patent Application No. 2007-239089, filed on Sep. 14, 2007, the entire contents of which are incorporated herein by reference.

BACKGROUND OF THE INVENTION

1. Field of the Invention

This invention relates to a non-volatile semiconductor memory device with a memory cell of a floating gate type, specifically relates to a method of controlling read/write of a NAND-type flash memory.

2. Description of the Related Art

A currently manufactured NAND-type flash memory has floating gate type of memory cells, write and erase of which are performed with electron-injection and electron-releasing of the respective floating gates (FGs). Controlling the electron injection quantity in a floating gate, it is able to set multiple threshold voltage states (i.e., data states). In practice, it has been achieved such a NAND-type flash memory that stores four level data (i.e., stores two bits per cell).

What becomes problematic when the NAND-type flash memory is more highly integrated and stores more data bits per cell is an interference noise between floating gates. This interference effect is defined as follows: assuming that a memory cell Cell_A is written, and then adjacent memory cell Cell_B is written, FG potential of Cell_A is influenced by the change of FG potential of Cell_B to be changed, so that the threshold distribution appears to be widened.

There has been proposed a write control scheme preferable for making the interference between cells less (refer to, for example, JP-A-2005-243205). In this write control scheme, it is not used such an upper page write mode that brings straight the lowermost level of four levels to the uppermost level. As a result, the interference noise between cells will be reduced. Additionally, in the write control scheme, word lines are basically selected in order from the source line side, and word line selecting orders of the lower page write and the upper page write are suitably combined so as to reduce the influence between cells.

However, as the highly integration of the NAND-type flash memories progresses, there is possibility that it becomes difficult to avoid the interference noise between adjacent cells.

SUMMARY OF THE INVENTION

According to an aspect of the present invention, there is provided a method for controlling a non-volatile semiconductor memory device having a NAND string, in which multiple memory cells are connected in series, including a read procedure performed for a selected memory cell in the NAND string on the condition that the selected memory cell is applied with a selected voltage while unselected memory cells are driven to be turned on without regard to cell data thereof, wherein a first read pass voltage is applied to unselected memory cells except an adjacent and unselected memory cell disposed adjacent to the selected memory cell, the adjacent and unselected memory cell being completed in data write later than the selected memory cell, and a second read pass voltage higher than the first read pass voltage is applied to the adjacent and unselected memory cell in the read procedure.

According to another aspect of the present invention, there is provided a method for controlling a non-volatile semiconductor memory device having a NAND string, in which multiple memory cells are connected in series, including a write-verifying procedure performed for a selected memory cell in the NAND string on the condition that the selected memory cell is applied with a write-verifying voltage and unselected memory cells are driven to be turned on without regard to cell data thereof; and a normal read procedure performed for a selected memory cell in the NAND string on the condition that the selected memory cell is applied with a read voltage and unselected memory cells are driven to be turned on without regard to cell data thereof, wherein in the write-verifying procedure, a first read pass voltage is applied to unselected memory cells except two adjacent and unselected memory cells disposed adjacent to the selected memory cell; a second read pass voltage higher than the first read pass voltage is applied to one cell of the two adjacent and unselected memory cells, the one cell having been written previously to the selected memory cell; and a third read pass voltage lower than the first read pass voltage is applied to the other cell, which is written later than the selected memory cell, and in the normal read procedure, the first read pass voltage is applied to the unselected memory cells except the two adjacent and unselected memory cells; the second read pass voltage higher than the first read pass voltage is applied to one cell of the two adjacent and unselected memory cells, the one cell having been written previously to the selected memory cell; and a fourth read pass voltage is applied to the other cell, which has been written later than the selected memory cell, the fourth read pass voltage being selected in level in accordance with the cell's threshold shift amount.

According to still another aspect of the present invention, there is provided a method for controlling a non-volatile semiconductor memory device having a NAND string, in which multiple memory cells are connected in series, including a write-verifying procedure performed for a selected memory cell in the NAND string on the condition that the selected memory cell is applied with a write-verifying voltage and unselected memory cells are driven to be turned on without regard to cell data thereof; and a normal read procedure performed for a selected memory cell in the NAND string on the condition that the selected memory cell is applied with a read voltage and unselected memory cells are driven to be turned on without regard to cell data thereof, wherein in the write-verifying procedure, a first read pass voltage is applied to unselected memory cells except adjacent and unselected memory cells adjacent to the selected memory cell; a second read pass voltage lower than the first read pass voltage is applied to one of the adjacent and unselected memory cells, which is written later than the selected memory cell, and in the normal read procedure, the first read pass voltage is applied to the unselected memory cells except the adjacent and unselected memory cells disposed adjacent to the selected memory cell; a third read pass voltage is applied to one of the adjacent and unselected memory cells, which has been written later than the selected memory cell, the third read voltage being selected in level in accordance with the cell's threshold shift amount, the maximum vale of which is higher than the first read pass voltage.

DETAILED DESCRIPTION OF THE EMBODIMENTS

Illustrative embodiments of this invention will be explained with reference to the accompanying drawings below.

Basic Configuration and Basic Write-control Scheme

Figure 1:
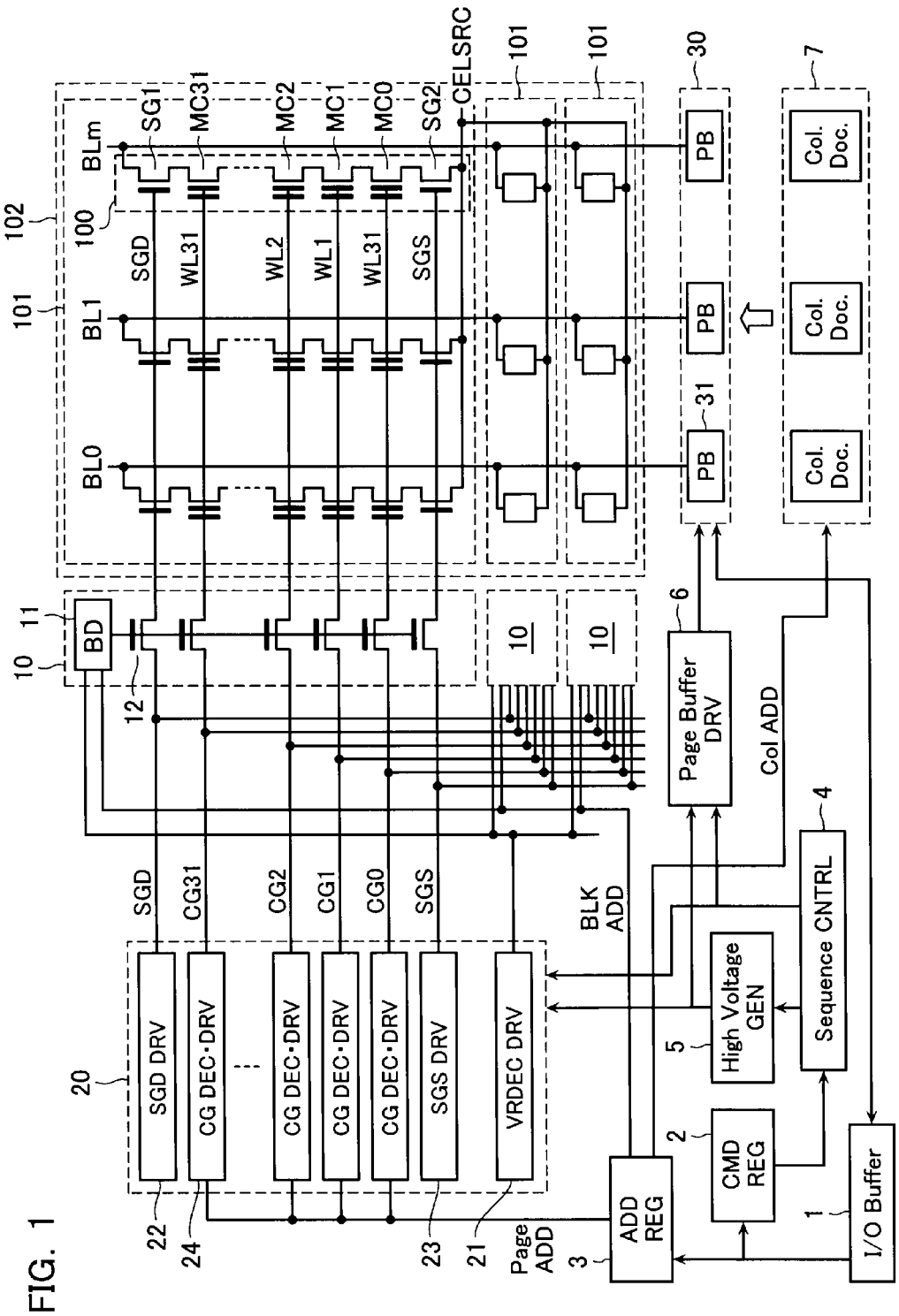
FIG. 1 shows a configuration of a NAND-type flash memory in accordance with an embodiment of the present invention.

FIG. 1 shows the whole configuration of a NAND-type flash memory in accordance with an embodiment. NAND cell unit (i.e., NAND string) 100, which is a basic unit of the NAND-type flash memory, has plural memory cells MC0-MC31 connected in series and two select gate transistors SG1 and SG2 disposed at the both ends.

One end of NAND cell unit 100 is coupled to bit line BL via the select gate transistor SG1; and the other end to common source line CELSRC via the select gate transistor SG2.

One memory cell has N-type source and drain diffusion layers formed on a P-well formed on a silicon substrate, and a stacked gate structure with a floating gate and a control gate stacked above the channel region defined by the source and drain layers. Changing the charge amount held in the floating gate by a write or erase operation, the threshold voltage of the cell is changed, so that one bit per cell or multiple bits per cell will be stored.

Control gates of the memory cells MC0-MC31 in the NAND cell unit 100 are coupled to different word lines WL0-WL31, respectively; and gates of the select gate transistors SG1 and SG2 to select gate lines SGD and SGS, respectively.

A set of NAND cell units 100, which shares word lines WL0-WL31 and select gate lines SGD and SGS, constitutes a block 101 serving as a data erase unit. Usually, as shown in the drawing, plural blocks are arranged in the bit line direction.

The various operations of the NAND-type flash memory are achieved together with command inputs. For example, in a write mode, data load command is input via input/output circuit 1 to be latched in command register 2; then write destination address is input via input/output circuit (I/O buffer) 1 to be latched in address register 3; write data is input via input/output circuit 1 to be loaded in sense amplifier circuit (serving as write circuit) 30; and write executing command is input via input/output circuit 1 to be latched in command register 2. As a result, the write operation will start automatically in the chip.

That is, the write executing command being input, sequence control circuit 4 starts to execute. This sequence control circuit 4 executes the following controls: voltage controlling necessary for data writing; timing controlling of write pulse applications and verify-reading operations; and repeat-controlling of the write pulse applications and verify-read operations until a desirable write operation is completed.

High voltage generation circuit 5 generates under the condition of the sequence control circuit 4 write voltage Vpgm, write pass voltage Vpass, read pass voltage Vread and other high voltages (boosted voltages) necessary for row-signal driving circuit 20, page buffer control circuit 6 and the like.

Row-signal driving circuit 20 has: CG decoder/drivers 24, the number of which is equal to that of word lines in a NAND cell unit; SGD driver 22 for controlling the drain side select gate line SGD; SGS driver 23 for controlling the source side select gate line SGS; and VRDEC driver 21 for outputting boosted supply voltage VRDEC used in the block decoder. These drivers 21-24 are shared by plural blocks 101 in the memory cell array 102.

It is required of the NAND-type flash memory to be used plural voltages applied to plural word lines in a selected NAND cell unit. Therefore, page addresses used for selecting word lines in the NAND cell unit in the row address will be input to the respective CG decoder/drivers 24.

Disposed at the word line end of each block in the memory cell array 102 is a narrow sensed row decoder 10, which has a block selecting function. Row decoder 10 has block decoder 11 for receiving the block address sent from address register 3 and decoding it, and transferring transistor array 12, the common gate of which is driven by the outputs of block decoder 11, for transferring voltages necessary for write, erase and read to the word lines and the select gate lines. Block decoder 11 includes a level shift circuit for outputting a required voltage to the common gate TG of the transistor array 12.

One ends of the transfer transistor array 12 are coupled to the respective drivers 21-24 while the other ends are coupled to word lines and select gate lines in the memory cell array 102. For example, at a write pulse application time, it is in need of applying a write voltage Vpgm (about 20V) to a selected word line. At this time, applied to the common gate TG is Vpgm+Vt (Vt; threshold voltage of the transfer transistor 12), which is supplied from VRDEC driver 21.

In the NAND-type flash memory, FN tunneling current is used for writing and erasing cells. Specifically in the writing mode, a lot of memory cells may be written simultaneously because a necessary current for shifting cell's threshold is very small as different from a NOR-type flash memory. Therefore, a page length, which is defined as a collectively processing unit in a write mode or read mode, will be set to be as large as 2 kByte or 4 kByte. Sense amplifier circuit (i.e., page buffer) 30 includes sense amps 31 with the same number as the page length.

Column decoder 7 decodes, for example at a write data loading time, column address sent from address register 3, and couples the input/output circuit 1 to selected sense amps PB, thereby making write data for the respective column addresses loaded in the sense amplifier circuit 30. In a read mode, read data stored in a lump in the sense amplifier circuit 30 are output to input/output circuit 1 as sequentially selected in accordance with column address.

Figure 2:
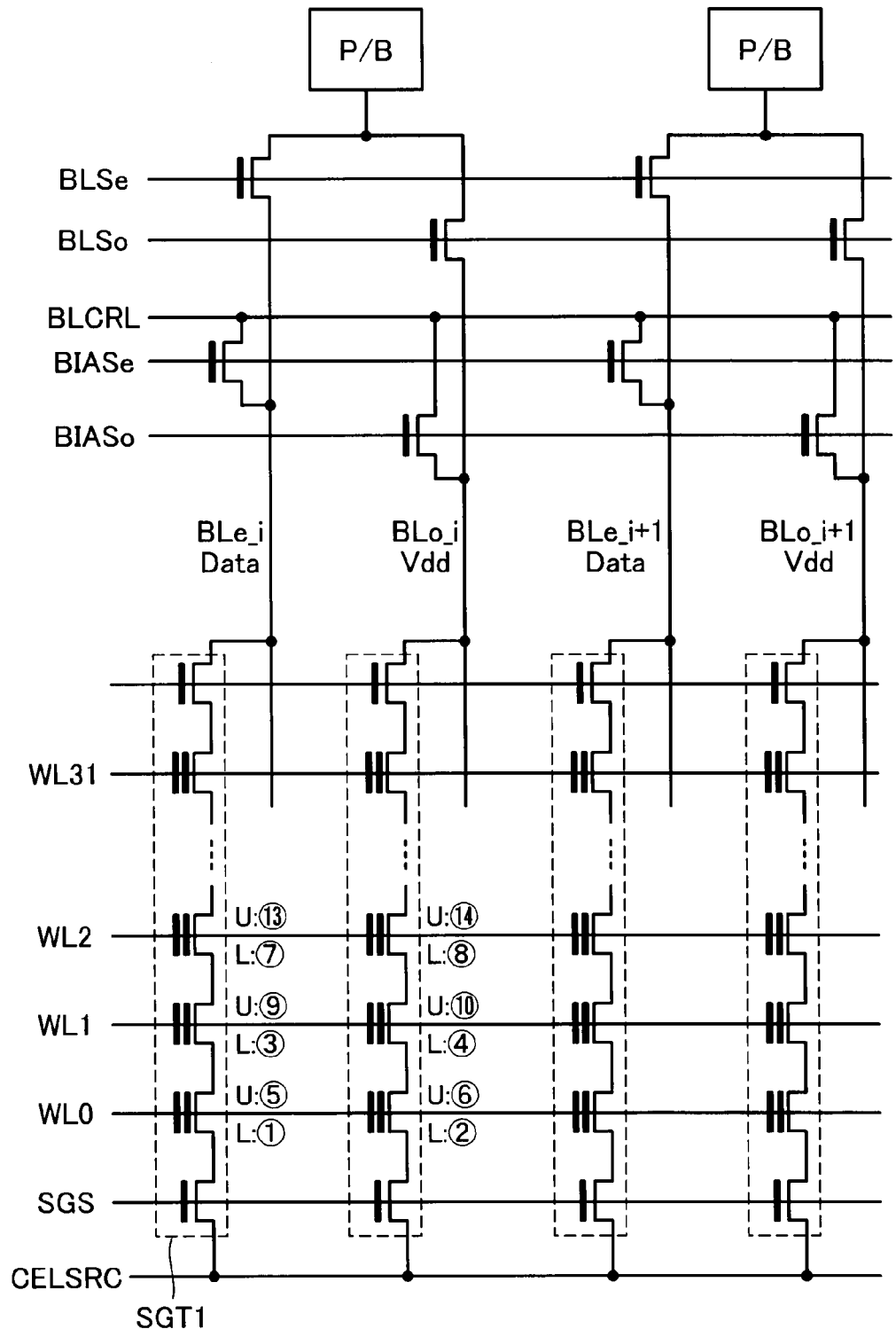
FIG. 2 is a diagram for explaining the data write order in the cell array in the flash memory.

FIG. 2 shows such an example that an even numbered bit line BLe and the adjacent odd numbered bit line BLo shares a sense amp PB. At a write time or a read time, the even numbered bit line BLe or the odd numbered bit line BLo is selected in accordance with selecting signals BLSe and BLSo to be coupled to sense amp PB. At this time, unselected bit lines serve as shield lines, so that the interference between adjacent bit lines will be suppressed. BLCRL is a certain voltage to be applied to unselected bit lines. To shield selected bit lines in a read operation or write-verify operation, for example, Vss is applied to unselected bit lines via transistors driven by BIASe and BIASo.

In case of this sense amplifier scheme, memory cells selected by a word line and all even-numbered bit lines constitute a page (even page) to be read or written simultaneously while memory cells selected by a word line and all odd-numbered bit lines constitute another page (odd page) to be read or written simultaneously.

Figure 3:
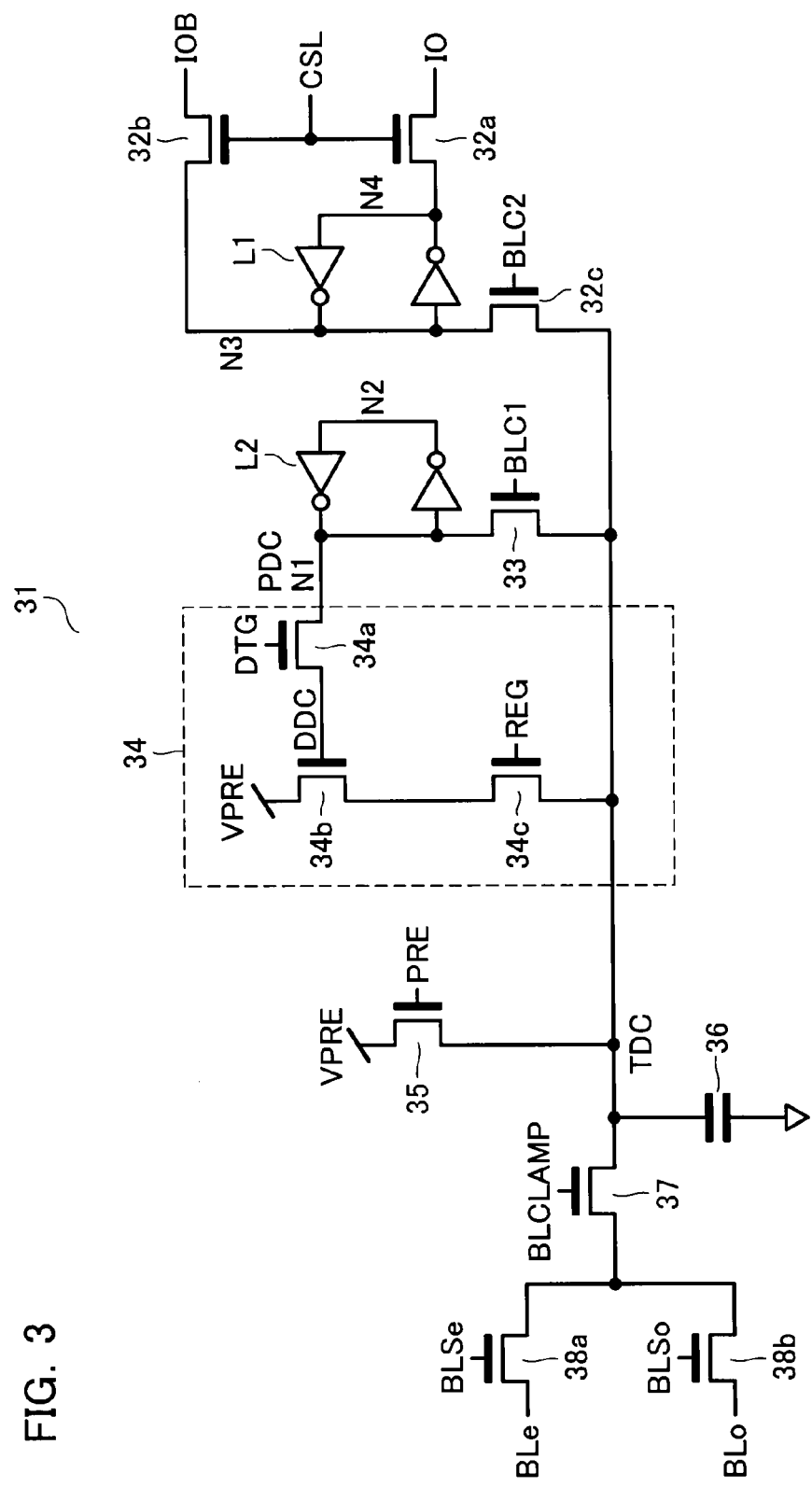
FIG. 3 shows the sense unit of the flash memory.

FIG. 3 shows the detailed example of the sense amp (PB) 31. Latch circuit L1 is selectively coupled to data lines IO and IOB by column select signal CSL output from the column decoder, and coupled to sense node TDC via transfer transistor 32c. In this example, latch L1 serves as a cache in the page buffer, or serves as data storage circuit used for achieving multi-level data storage such as 2-bit per cell.

Another latch circuit L2 is coupled to the sense node TDC via transfer transistor 33, and coupled to operational circuit 34 via transfer transistor 34a. The operational circuit 34 including transistors 34a, 34b and 34c may execute some operations for the sense node TDC in accordance with the potential of gate node DDC of transistor 34b. For example, setting drain voltage VPRE of transistor 34b at 0V when DDC is "H", and turning on transistor 34c, the potential of node TDC will be changed in accordance with data at DDC.

Transistor 35 is a bit line precharging transistor. Transistor 37 is one used for coupling a bit line to the sense node TDC. This transistor 37 serves for amplifying a small bit line amplitude in accordance with gate voltage control thereof at a read time, and serves for coupling the latch circuit to the bit line at a write time.

Transistors 38a and 38b are high breakdown voltage ones, which serve for not only shutting erase voltage of about 20V to be applied to bit lines but also selecting the even and odd bit lines BLe and BLo.

Figure 4:
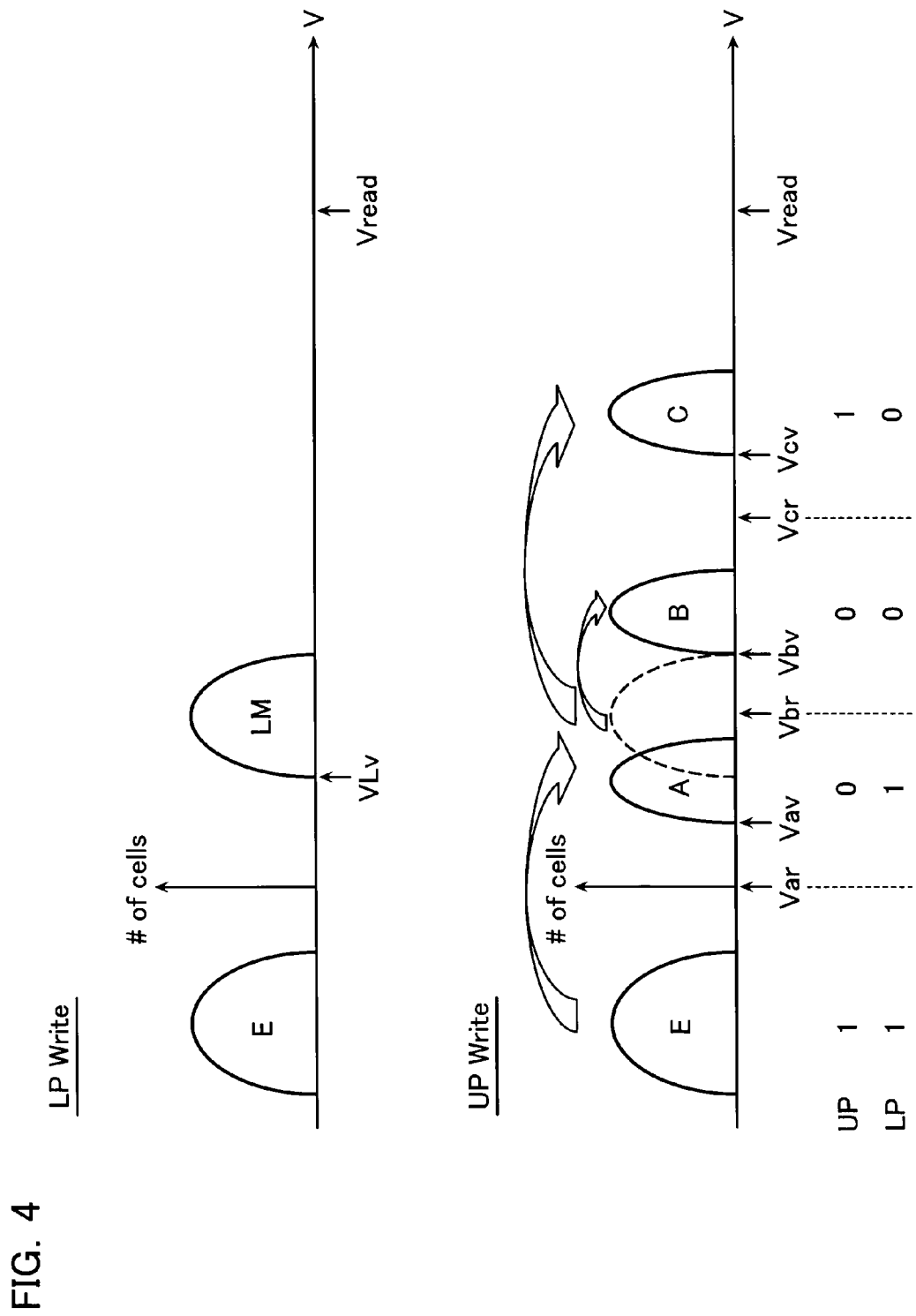
FIG. 4 shows the 4-level data threshold distribution of the flash memory.

FIG. 4 is a diagram for explaining the principle of writing four-level data (two-bits per cell data) in this embodiment. Four-level data are referred to as level "E", level "A", level "B" and level "C" in order from the lower side of the cell's threshold voltage. Level "E" is a negative threshold voltage state obtained by a collective block erase. It is shown in FIG. 4 a data bit assignment example of assigning the lower page (LP) bit and upper page (UP) bit to the respective data levels.

In the lower page (LP) write (or program), cells of level "E" are selectively set up to have a medium level "LM", that is set between levels "A" and "B". After the LP write, the upper page (UP) write is performed. In the upper page write, level "A" write from level "E" and level "B" or "C" write from level "LM" are performed simultaneously.

The lower limit values of the threshold voltages of levels "LM", "A", "B" and "C" are defined by verifying voltages VLv, Vav, Vbv and Vcv, respectively, used at the respective write-verify times.

The basic data write order (word line selection order) in this embodiment is shown in FIG. 2. Here, "L" and "U" designate the lower page (LP) and upper page (UP), respectively while numerals shown at the side of L/U designate the write order.

That is, assuming that cells in the NAND string are written in order from the source line side, first, the lower page, L:①, of word line WL0 on the even numbered bit line BLe side is written; then, the lower page, L:②, of word line WL0 on the odd numbered bit line BLo side is written. Following it, the lower page, L:③, of word line WL1 on the even numbered bit line BLe side is written; and then, the lower page, L:④, of word line WL0 on the odd numbered bit line BLo side is written. Next, the upper page, U:⑤, of word line WL0 on the even numbered bit line BLe side is written; and then, the upper page, L:⑥, of word line WL0 on the odd numbered bit line BLo side is written.

Successively, go to word line WL2, and the lower page, L:⑦, on the even numbered bit line BLe side is written; and then, the lower page, L:⑧, of word line WL2 on the odd numbered bit line BLo side is written. Following it, go back to word line WL1, and the upper page, U:⑨, on BLe is written; and then the upper page, U:⑩, of the word line WL1 on the odd bit line BLo side is written. Hereinafter, the same write operation will be repeated.

Data writing in accordance with the above-described order, it becomes possible to prevent the adjacent cell from being written into C level from E level after having decided a noticed cell's threshold at either one of A to C levels. The threshold change of the adjacent cell of the noticed cell after writing it will be suppressed to be about a half (i.e., E→A, LM→C) in comparison with the change from E level to C level, and resulting in that the interference effect of cells is reduced in half.

Subject to be Solved

Although the basic configuration and basic write control scheme have been explained above, there are remained problems to be solved, which will be explained in detail below.

Figure 5:
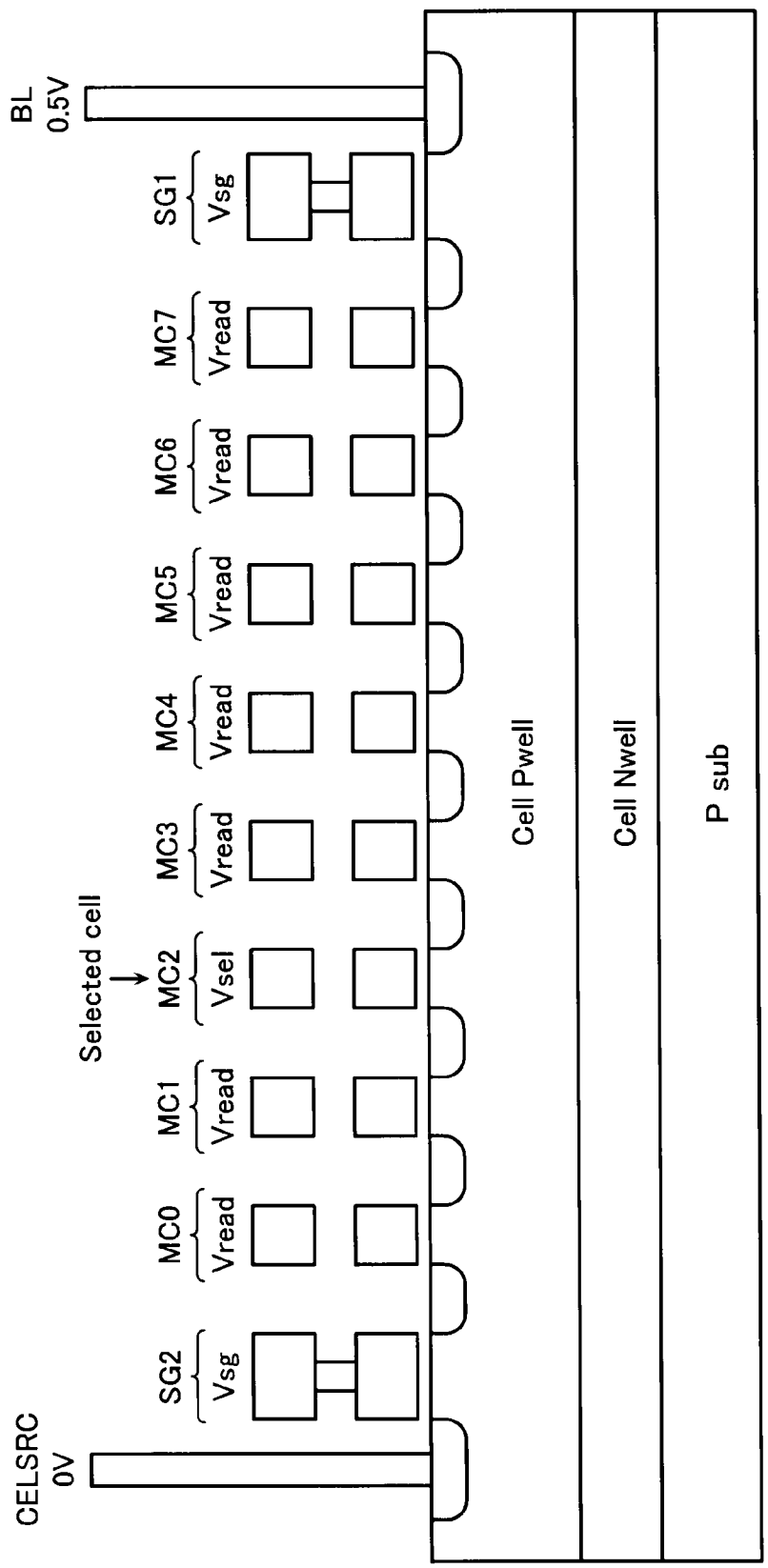
FIG. 5 shows the conventional bias relationship in the NAND string at a write-verify time and a normal read time.

FIG. 5 shows a bias relationship in the NAND string at a write-verify read time or a normal read time. To explain the problem briefly, here is shown an example of the NAND string, in which eight memory cells MC0-MC7 are used.

When memory cell MC2 is selected, the selected word line WL2 is applied with select voltage Vsel while unselected word lines WL0-1 and WL3-7 (i.e., unselected memory cells) are applied with read pass voltage Vread that is necessary to turn on cells without regard to cell data. The select voltage Vsel is either one selected from verify voltages VLv, Vav, Vbv and Vcv, which are selected in accordance with write levels, at a write-verify time, or either one selected from read voltages Var, Vbr and Vcr set between the respective data levels at a normal read time.

Figure 6:
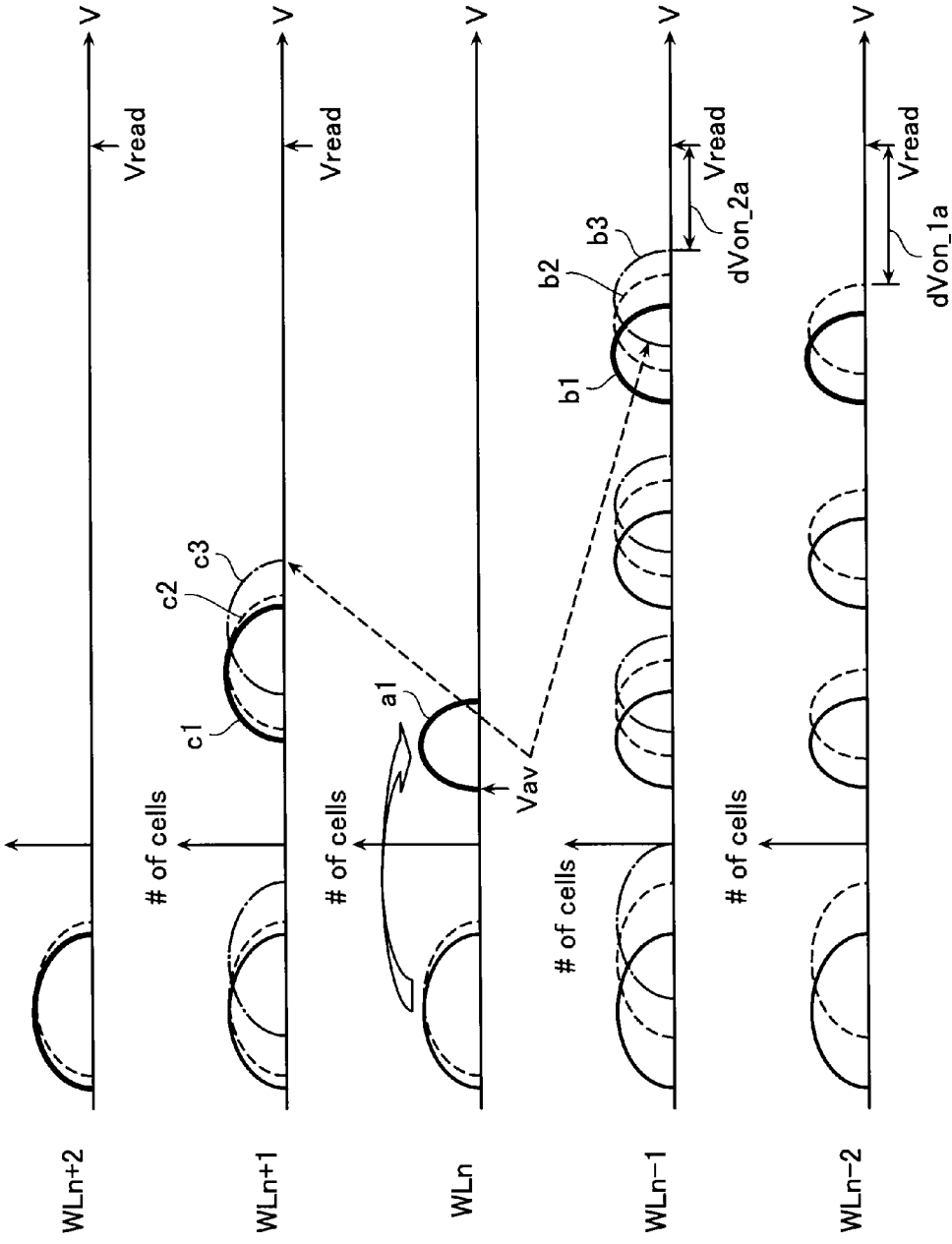
FIG. 6 shows the cell threshold distribution at a normal upper page write-verify time.

FIG. 6 shows the memory cells' situations in the range of word lines WLn–WLn+2 at a write-verify time after the upper page writing of A level into a cell selected on word line WLn. When upper page write is performed for a memory cell on the word line WLn, memory cells on the word lines WLn−1 and WLn−2 have been completed in data write to be set at either one of E to C levels. The memory cell on the word line WLn+1 is set in the lower page write state (LM level) or the E level state in accordance with the write order explained with reference to FIG. 2. The memory cell on the adjacent word line WLn+2 is set in the E level state (i.e., erase state).

Notice here the C level of the memory cell on the word line WLn−1, which has already been written. The cell threshold distribution becomes "b1" shown by a solid line when there is not influenced by the interference between floating gates while it becomes "b2" shown by a dotted line when there is influenced by it. With respect to word line WLn+1, distribution "c1" shown by a solid line is obtained without the interference while distribution "c2" shown by a dotted line is obtained with the interference.

Note here that unselected word lines WLn−1 and WLn+1 disposed adjacent to the selected word line WLn are different in condition from the remaining unselected word lines with respect to the interference effect between adjacent cells. That is, each of the remaining word lines and the selected word lines is sandwiched by word lines with Vread applied. By contrast, with respect to word lines WLn−1 and WLn+1, one of word lines adjacent to them are set at Vread while the other are set at Vav.

As a result, the memory cells on the unselected word lines WLn−1 and WLn+1, one of the two adjacent word lines of each of which is low in potential, have an apparently higher threshold state than those on the remaining unselected word lines because of a large interference of adjacent cells. This will be explained with reference to FIG. 8.

Figure 8:
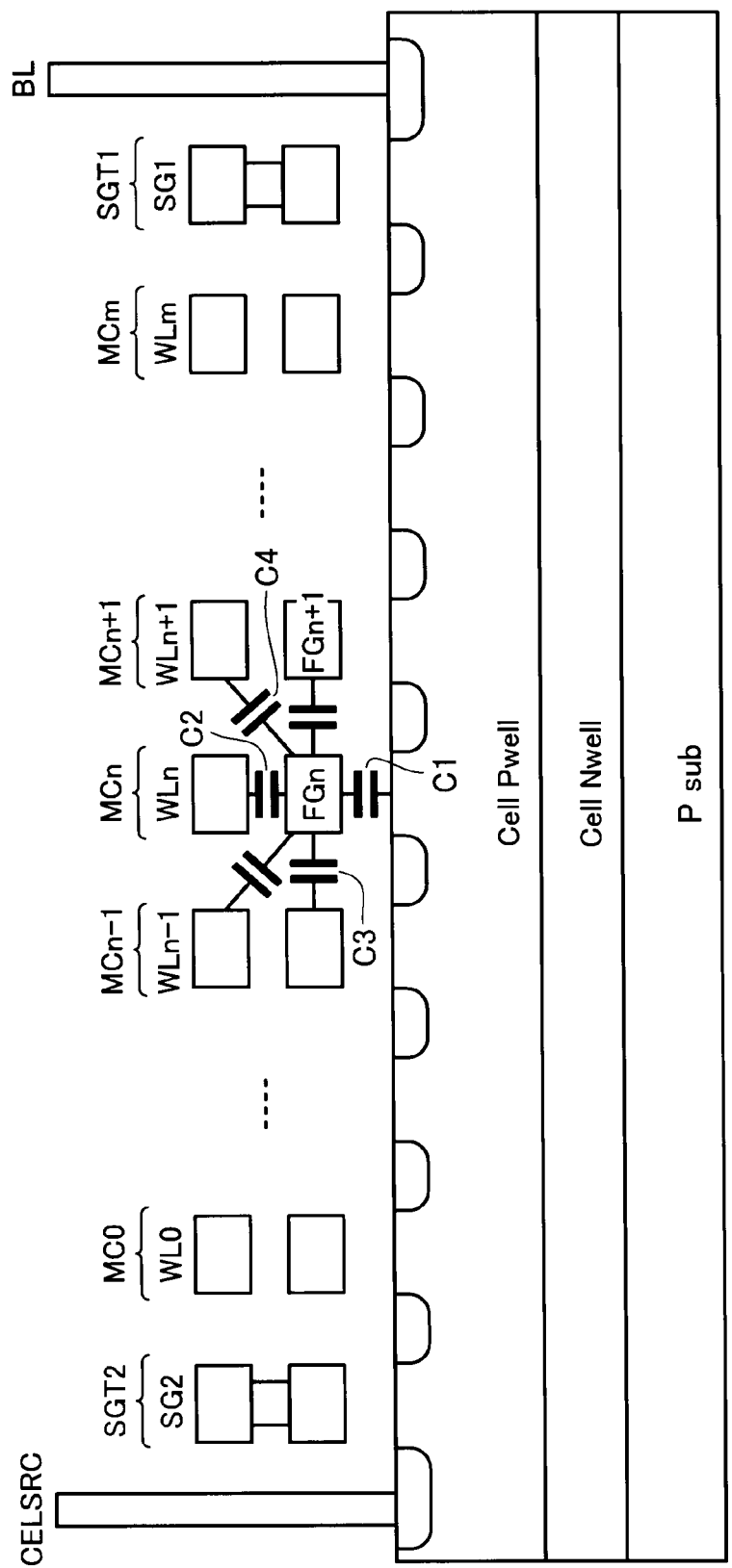
FIG. 8 shows the capacitive coupling state in the sectional view of the NAND string.

FIG. 8 shows capacitive coupling situations of the floating gate FGn of a memory cell MCn in a NAND string, which affect the floating gate potential. That is, FGn is coupled to the control gate (i.e., word line WLn) stacked thereabove via capacitance C2, and coupled to the channel via capacitance C1. Basically, floating gate potential control and channel potential control are achieved by the capacitance coupling ratio of these capacitances C1 and C2.

On the other hand, as the cell size is shrunk, the floating gate FGn of the noticed cell is strongly coupled to adjacent floating gates and adjacent word lines with capacitances C3 and C4, respectively.

Under the capacitive coupling situations, when word line WLn+1 is applied with the read pass voltage Vread and word line WLn is applied with a read voltage lower than the read pass voltage, the floating gate FGn+1 under the word line WLn+1 becomes lower in potential than the case where FGn+1 is directly controlled by the word line WLn+1 with Vread applied. The reason is as follows: a first capacitive coupling effect, in which the potential of FGn+1 is reduced from word line WLn via the floating gate FGn+1 (i.e., via capacitance C2 and C3), and a second capacitive coupling effect, in which the potential of FGn+1 is reduced from word line WLn directly, are overlapped, so that the floating gate FGn+1 is not sufficiently increased in potential with Vread.

Explaining in other words, the memory cell under a unselected word line adjacent to the selected word line becomes apparently high in threshold. As shown in FIG. 6, the memory cell set at LM level under the unselected word line WLn+1 has apparently distribution "c3" shown by a dash line while the memory cell set at C level under the word line WLn−1 has apparently distribution "b3" shown by a dash line.

As a result, as shown in FIG. 6, the relationship between on-margin dVon_2a against Vread of a cell under the unselected word line WLn−1 and on-margin dVon_1a of another cell under the unselected word line WLn−1 becomes as follows: dVon_1a>dVon_2a.

Figure 7:
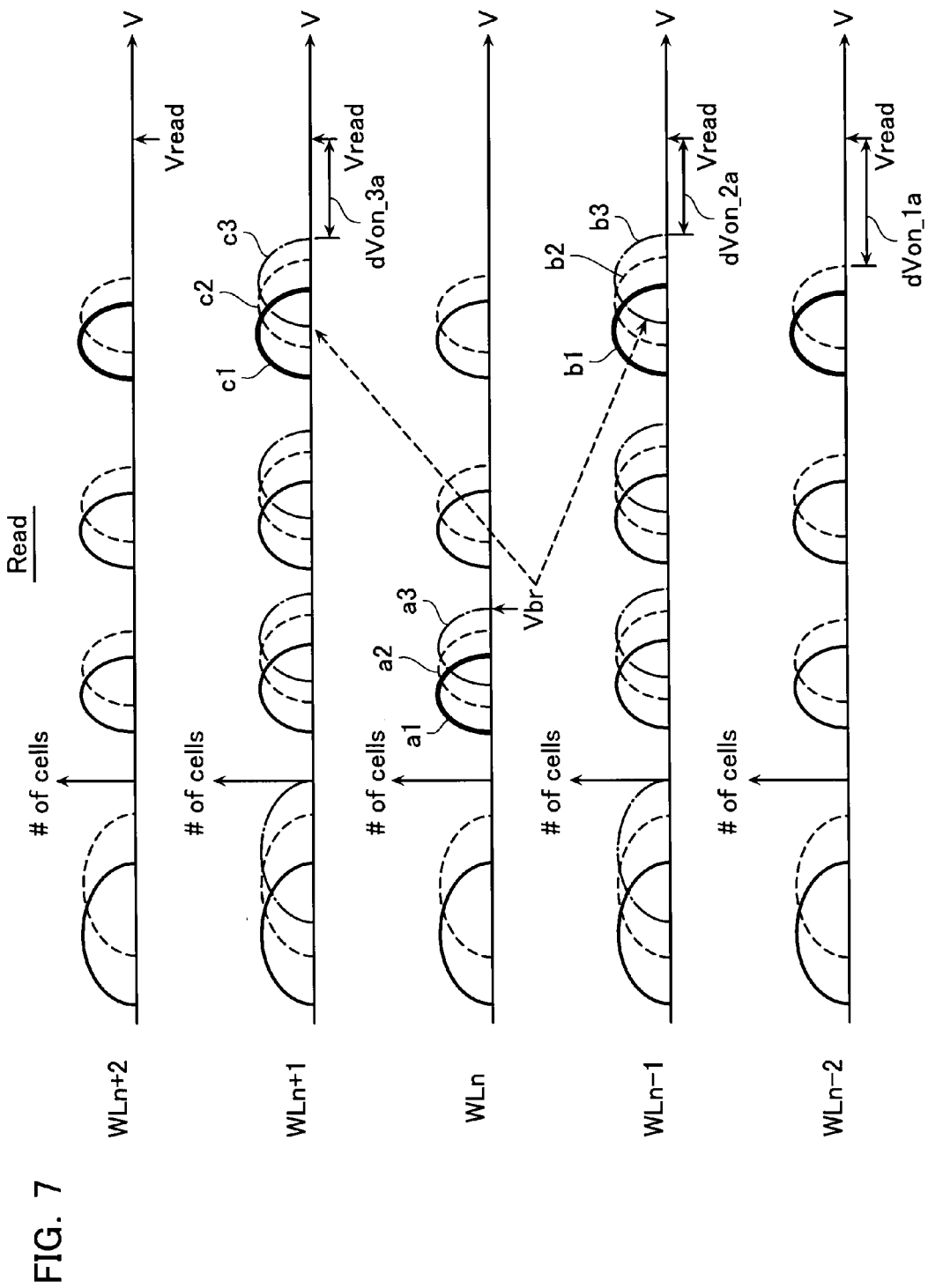
FIG. 7 shows the cell threshold distribution at a normal read time.

Next, FIG. 7 shows cell threshold states in the range of word lines WLn−2 to WLn+2 when the cell data (A level) of the word line WLn is read after writing all memory cells. Here is shown that all memory cells have threshold distributions shifted in the positive direction (shown by dotted lines) from the predetermined threshold states (shown by solid lines) due to the interference of adjacent cells.

It will be guessed that the C-level cell under the word line WLn−1 becomes to have distribution "b3" shown by dash line as similar to that in the case shown in FIG. 6 when the read voltage of the word line WLn is set at about A level. By contrast, C-level cell under the word line WLn+1 appears to have distribution "c3" as shown by a dash line due to the interference of cells under the selected word line WLn with the read voltage applied.

The threshold voltage change of the A level cell under the selected word line WLn will be explained as follows: in reception of the result that distributions "c1" to "c3" of LM levels of cells under the word line WLn+1 shown in FIG. 6 are shifted to distributions "c1" to "c3" of C level cells under the word line WLn+1 shown in FIG. 7, data distribution "a1" shown by a solid line is shifted to distribution "a2" shown by a dotted line due to the interference between floating gates FG. In addition to this, the cell threshold distribution of the unselected word line WLn+1 becomes apparently to have distribution "c3". Assuming that the increase of the on-resistance influences the cell current Icell of the memory cell at the cell threshold setting time, the distribution of the cell to be written into the A level under the word line WLn will be further shifted in the positive direction as shown by "a3".

The effect of expanding the post-write data threshold distributions due to the on-margins of unselected cells against the read pass voltage is referred to as a "back pattern noise". In general, in such a cell that is easily written in a NAND string, the back pattern noise appears large. That is, the nearer to the cell source line, the larger the back pattern noise appears. However, when the interference between cells becomes large due to the cell miniaturization, it becomes difficult to ignore the interference even if it is due to one cell, and the interference influence appears as a result of the reduction of on-margin.

The above-described influence on the threshold voltage of the adjacent cell due to the selected word line will be explained together with a detailed numerous example with reference to the coupling capacitances shown in FIG. 8. Assuming that the select voltage of the selected word line is Vsel, and unselected word line voltage is Vread, the apparent threshold voltage shift ΔVt of a memory cell under the adjacent and unselected word line due to the word line voltage difference ΔVwl(=Vread−Vsel) will be expressed by the following expression Exp. 1.

$$\Delta Vt = \{(C4 + C3 \cdot Cr)/C2\} \Delta Vwl \qquad [\text{Exp. 1}]$$

where, Cr=C2/Call (Call is the total capacitance value of FGn).

By use of the following numerous example of: (C4+C3·Cr)/C2=0.066; and ΔVwl=4.5v (Vread=5.5V, Vsel=1V) as used in the conventional NAND-type flash memory, ΔVt=0.3V is obtained. In other words, the difference between threshold distributions "c2" and "c3" in FIG. 7 becomes 0.3V.

Next, by use of the following numerous example of: (C4+C3·Cr)/C2=0.13; and ΔVwl=4.5v as obtained in case the interference between cells becomes large due to the cell miniaturization, $\Delta Vt=0.59V$ is obtained. In other words, the difference between threshold distributions "c2" and "c3" in FIG. 7 becomes 0.59V. "c2" is the upper limit of the threshold distribution of unselected cells apart from the selected cell by a distance of two cells or more. As the interference between cells becomes larger, as shown by the distribution "c3", the upper limit of the threshold voltage distribution of the adjacent and unselected cells becomes higher.

Conventionally, the read pass voltage Vread is set at about 5.5V, and the upper limit of the distribution "c2" is set at about 4V. In the NAND-type flash memory belonging to a generation, in which the design rule is larger than 56 nm, the difference between the distributions "c2" and "c3" is about 0.3V, so that the back pattern noise due to the unselected cells adjacent to the selected cell is not problematic. However, in such a generation that the design rule is 56 nm or less, as explained in the calculation example, the difference between distributions "c2" and "c3", i.e., the threshold voltage difference, becomes about 0.6V. As a result, when estimating the device with the same read pass voltage and the upper limit of the threshold voltage, the back pattern noise becomes apparent remarkably.

The condition of that the above-described effect starts to be apparent as the back pattern noise is in the fact that the difference between the read pass voltage and the upper limit of the distribution "c3", i.e., on-margin dVon_3a of the unselected cell as shown in FIG. 7, is about 1V or less. This fact has been obtained as an experimental result.

First R/W Scheme in the Embodiment

Figure 9:
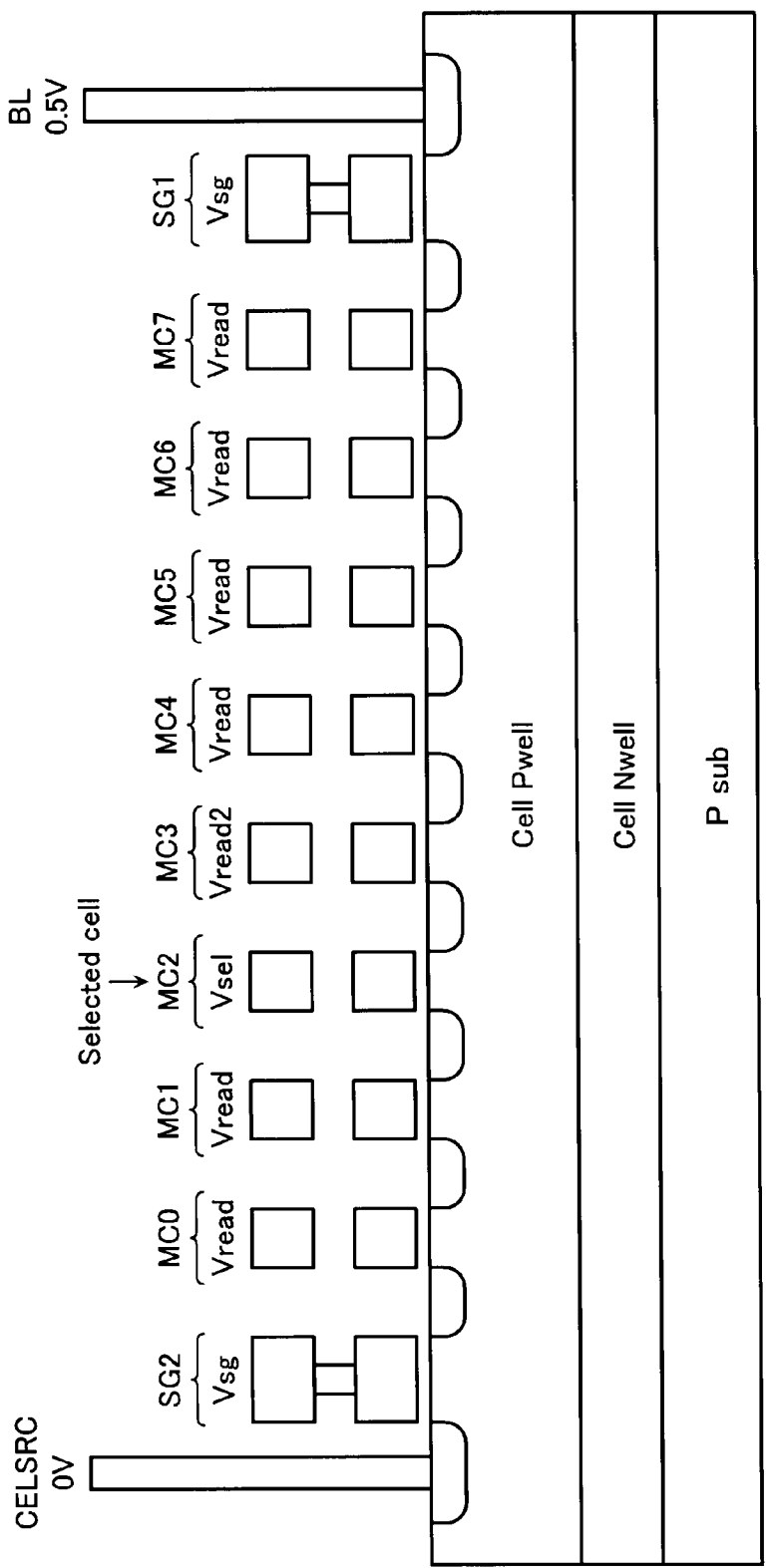
FIG. 9 shows the bias relationship in the NAND string at a write-verify time and a normal read time in the first mode of this embodiment.
Figure 10:
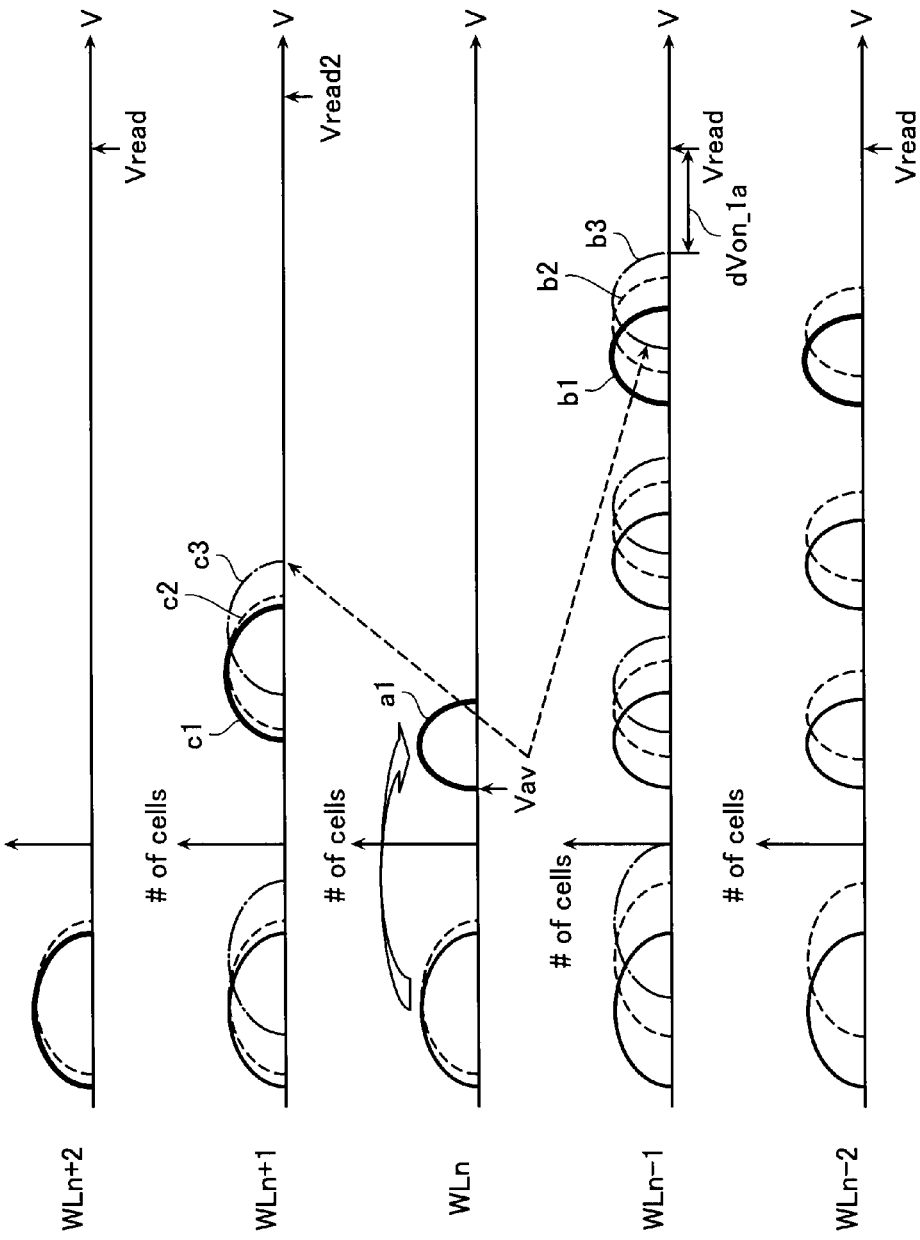
FIG. 10 shows the threshold distribution at the upper page write-verify time in the first mode with reference to FIG. 6.
Figure 11:
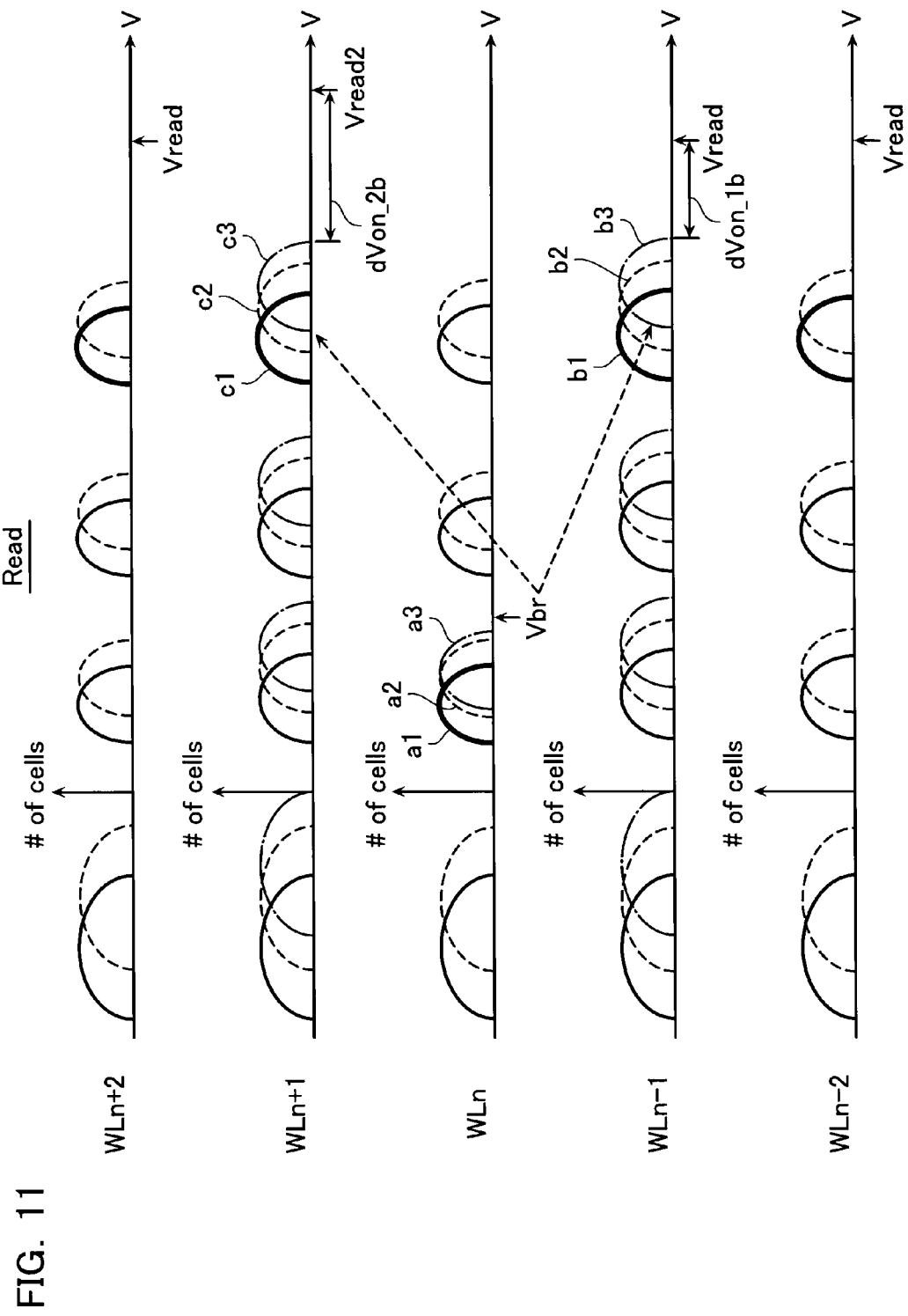
FIG. 11 shows the threshold distribution at the normal read time in the first mode with reference to FIG. 7.

FIG. 9 shows a word line voltage applying state set in a NAND string at a write-verify time and a normal read time in a first read/write (R/W) scheme in accordance with this embodiment in comparison with that shown in FIG. 5. FIG. 10 shows cells' threshold states of word lines adjacent to a selected word line WLn at the upper page write-verify time of the selected word line WLn, and FIG. 11 shows the cell's threshold state of the selected word line WLn at a read time after writing all cells in comparison with those shown in FIGS. 6 and 7, respectively.

As shown in these FIGS. 9, 10 and 11, a unselected word line WLn+1 adjacent to the selected word line WLn on the bit line side (i.e., on the side of a cell to be written later than the selected cell) is applied with read pass voltage Vread2 higher than the read pass voltage Vread applied to the remaining unselected word lines at the write-verify time and the read time.

Vread2 is an adjusted voltage such as to be able to cancel the apparent threshold increase of the unselected cell under the adjacent and unselected word line WLn+1 due to the read voltage of the selected word line WLn. If Vread2-Vread is too large, in a unselected word line, the both adjacent word lines of which are applied with Vread, the on-margin against Vread is reduced, and resulting in that the back pattern noise due to word lines WLn+2~WLm becomes large. Therefore, it is desired to set Vread2 at such a level that is able to suppress the influence in the memory cells under word line WLn+1.

Figure 12:
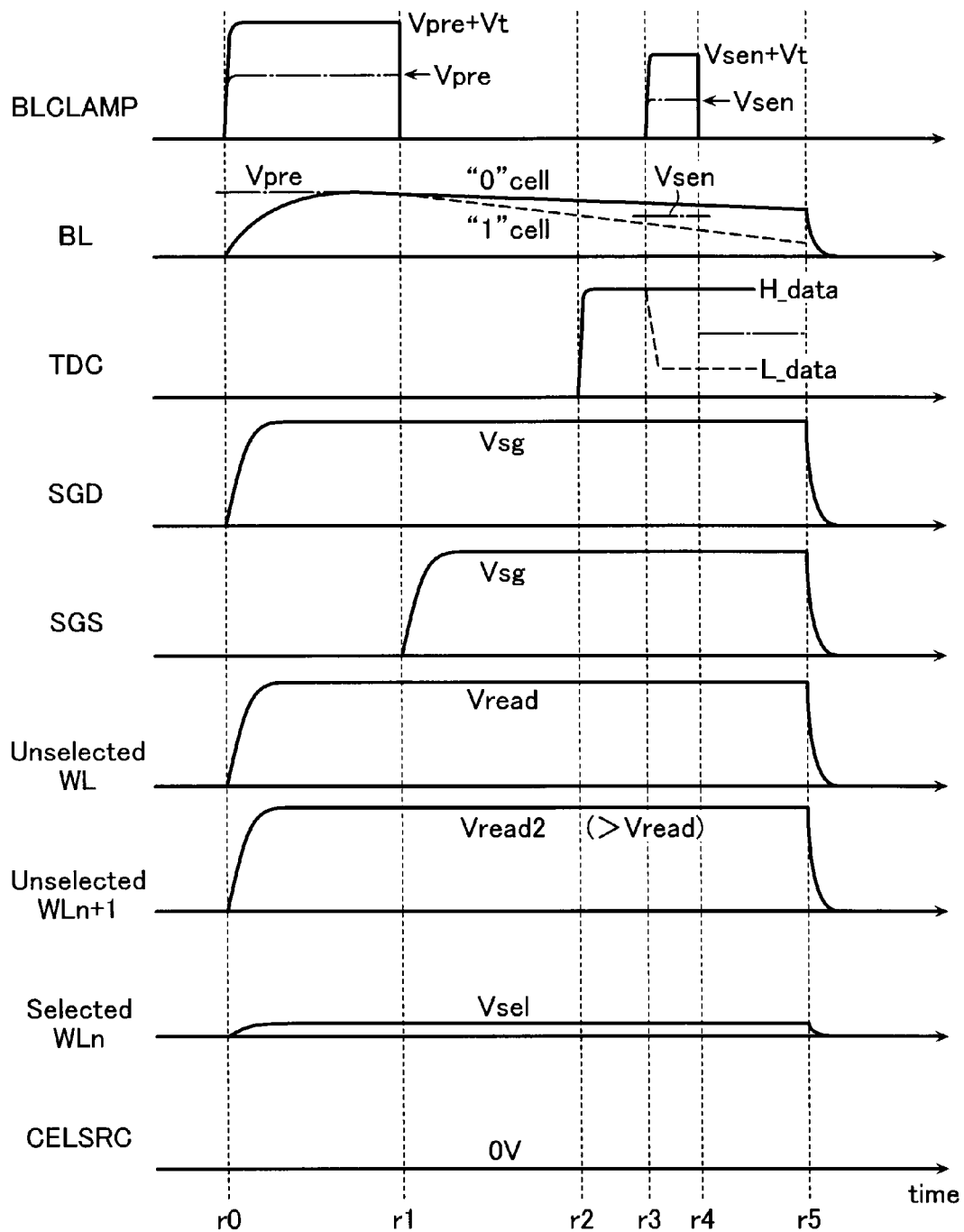
FIG. 12 shows read operation waveforms in the first mode.

FIG. 12 shows operation waveforms at the write-verify time and the read time. Select voltage Vsel applied to the selected word line WLn is either one of verify voltages VLv, Vav, Vbv and Vcv at the write-verify time, and either one of read voltages Var, Vbr and Vcr at the read time.

Applied to the adjacent and unselected word line WLn+1 on the bit line side of the selected word line WLn is a pass voltage Vread2 higher than Vread applied to the remaining unselected word lines. As a result, the increase of the back pattern noise due to the selected word line voltage will be suppressed.

The operation will be explained below in accordance with the sense unit configuration shown in FIG. 3. At timing r0, select voltage Vsel is applied to the selected word line WLn; Vread2 is applied to the adjacent and unselected word line WLn+1; Vread is applied to the remaining unselected word lines; and Vsg is applied to the select gate line SGD for turning on the select gate transistor. At the same time, the bit lines are precharged for data reading.

For example, when even numbered bit lines BLe are subjected to data read, these are set at "H", and Vpre+Vt is applied to BLCLAMP, so that the even numbered bit lines, BLe, are precharged. Odd numbered bit lines, BLo, are set as Vss, and serve as shield lines.

After the word lines and bit lines have been set at certain levels, respectively, stop the bit line precharge operation at timing r1, and raise simultaneously the select gate line SGS on the source line side to turn on the select gate transistor SG2, thereby discharging the bit lines in accordance with data of selected cells. If the threshold voltage of a selected cell is lower than the select voltage (i.e., data "1"), the bit line is discharged while if not so (i.e., data "0"), the bit line is not discharged.

Prior to data sensing, sense node TDC is precharged at timing r2. Then, clamping transistor is turned on at timing r3, thereby coupling the bit line to the sense node TDC. Assuming that the sense level is Vsen set between "0" and "1", BLCLAMP is applied with Vsen+Vt, which is able to turn on transistor 37 when bit line level is Vsen. Since bit line capacitance is sufficiently larger than the capacitance of the sense node TDC, the bit line potential change with small amplitude will be amplified at the sense node TDC.

Although, after timing r4, the write-verify operation and the normal read operation has a slight difference, data at the sense node after sensing, or data after certain operational processing at the sense node TDC is stored in latch L1. Finally, discharging word lines and bit lines at timing r5, the write-verify operation or the normal read operation ends.

Introducing the above-described read pass voltage Vread2, the on-resistance increase of the cell under the unselected word line WLn+1 is suppressed, and the threshold voltage shift of the selected cell under the selected word line is suppressed. Explaining in detail, as explained with reference to FIG. 7, if the on-resistance of the cells under the unselected word line is increased, the cell threshold to be written to A-level will be shifted in the positive direction as shown by distribution "a3".

By contrast, according to this embodiment, as shown in FIG. 11, the threshold shift amount from "a2" to "a3" of the selected cell becomes less. As explained in the above-described analyzing results, this effect becomes remarkable in a generation, the design rule of which is 56 nm or less.

Second R/W Scheme in the Embodiment

Figure 13:
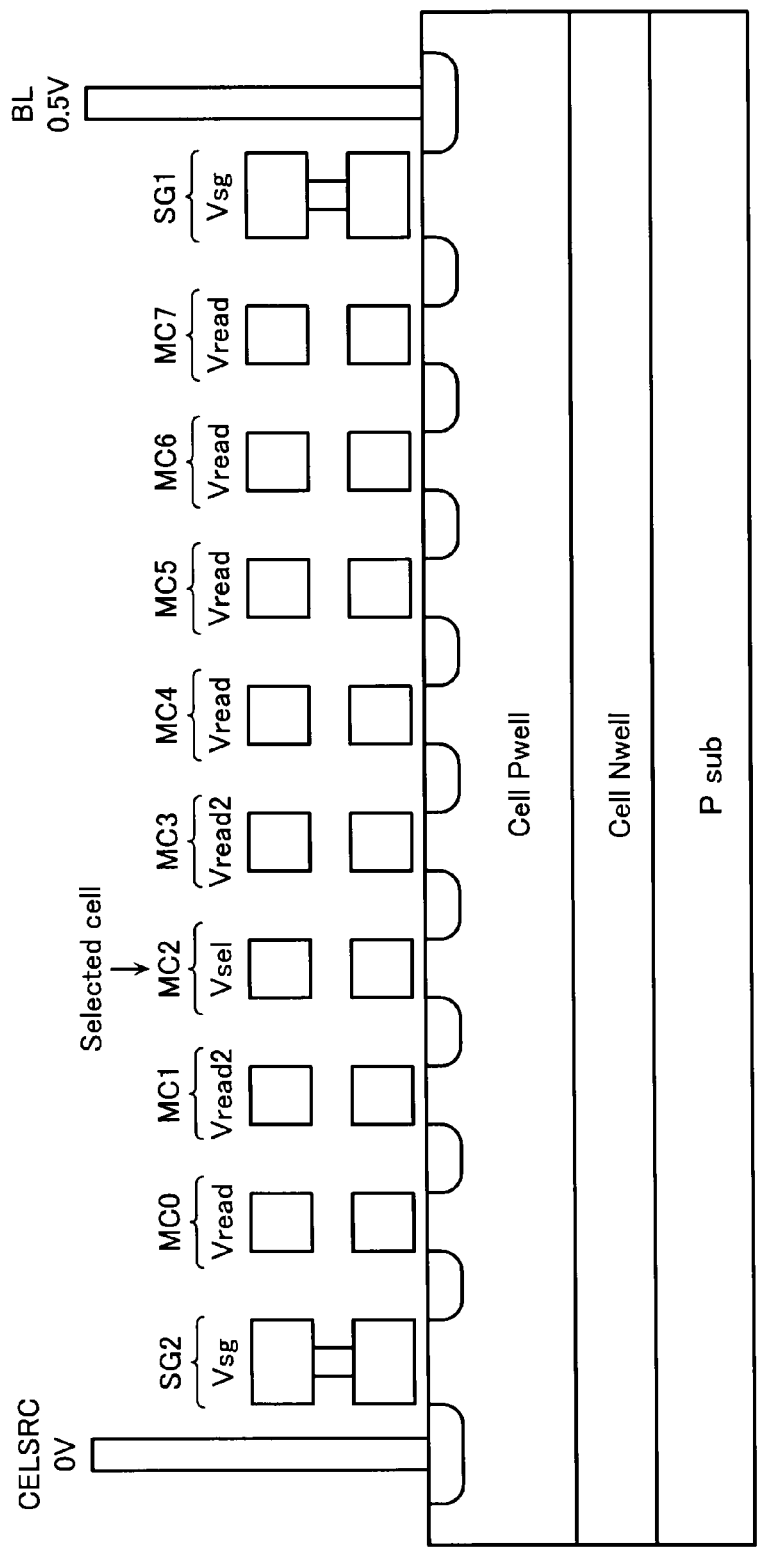
FIG. 13 shows the bias relationship in the NAND string at a write-verify time and a normal read time in the second mode of this embodiment.
Figure 14:
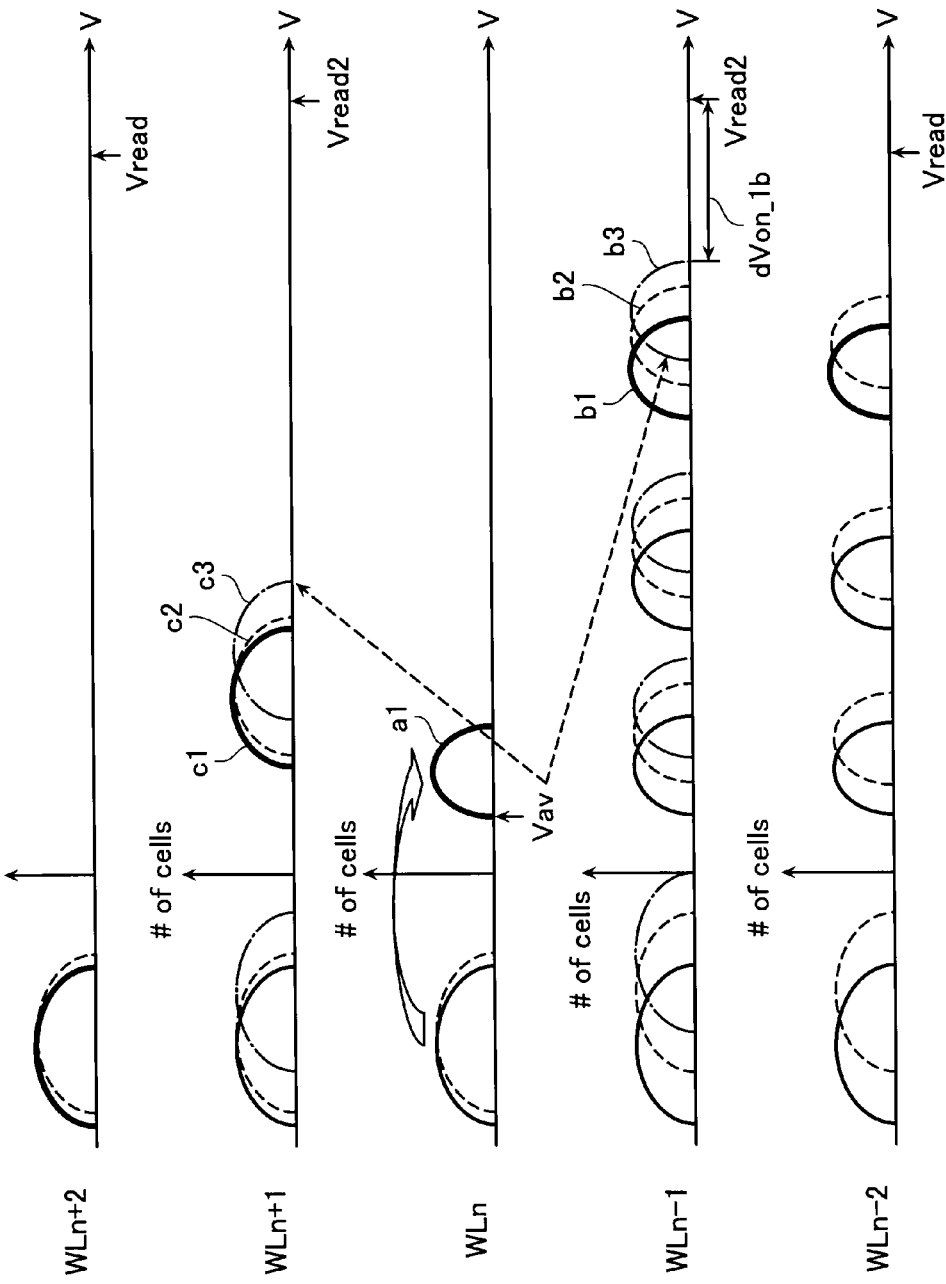
FIG. 14 shows the threshold distribution at the upper page write-verify time in the second mode with reference to FIG. 6.
Figure 15:
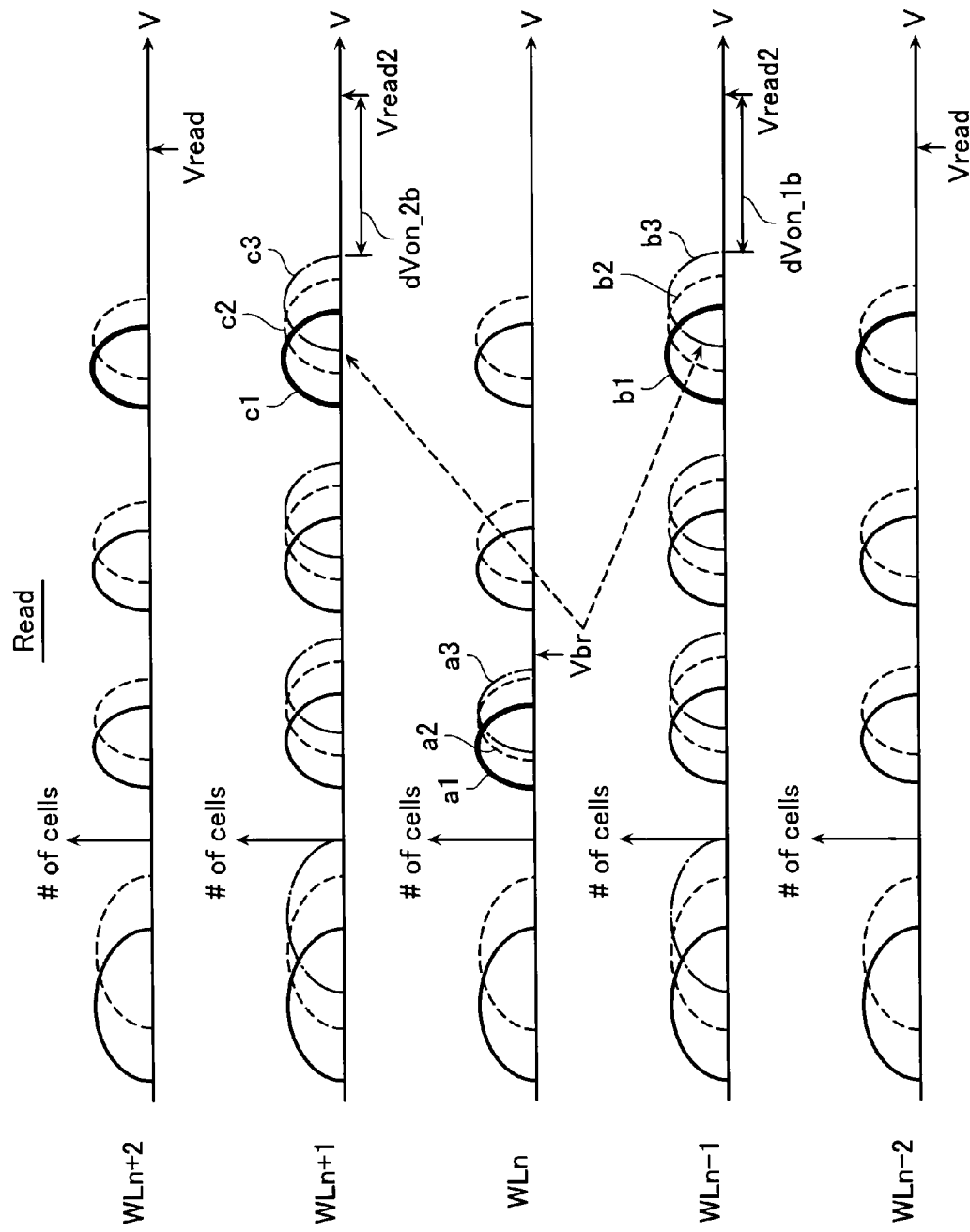
FIG. 15 shows the threshold distribution at the normal read time in the second mode with reference to FIG. 7.

FIG. 13 shows a word line voltage applying state set in a NAND string at a write-verify time and a read time in a second read/write (R/W) scheme in accordance with this embodiment in comparison with those shown in FIGS. 5 and 9. FIG. 14 shows cells' threshold states of word lines adjacent to a selected word line WLn at the upper page write-verify time of the selected word line WLn, and FIG. 15 shows the cell's threshold state of the selected word line WLn at a read time after writing all cells in comparison with those shown in FIGS. 6, 10 and 7, 11, respectively.

This second R/W scheme is different from the first R/W scheme in the following fact: in this second R/W scheme, as shown in FIG. 13, not only the adjacent and unselected word line WLn+1 on the bit line side of the selected word line WLn but also the adjacent and unselected word line WLn−1 on the source line side of the selected word line WLn are applied with read pass voltage Vread2 higher than Vread applied to the remaining unselected word lines.

Vread2 is an adjusted voltage such as to be able to cancel the apparent threshold increase of the unselected cell under the adjacent and unselected word lines WLn+1 and WLn−1 due to the read voltage of the selected word line WLn. If Vread2−Vread is too large, in a unselected word line, the both adjacent word lines of which are applied with Vread, the on-margin against Vread is reduced, and resulting in that the back pattern noise due to word lines WLn+2~WLm becomes large. Therefore, it is desired to set Vread2 at such a level that is able to suppress the influence in the memory cells under word line WLn+1.

According to this second R/W scheme, in addition to the effect obtained in the first R/W scheme, it will be provided the following effect that the reduction of cell current Icell of the whole NAND string due to the reduction of on-margin of the cell under the word line WLn−1 is suppressed.

Third R/W Scheme in the Embodiment

Figure 16:
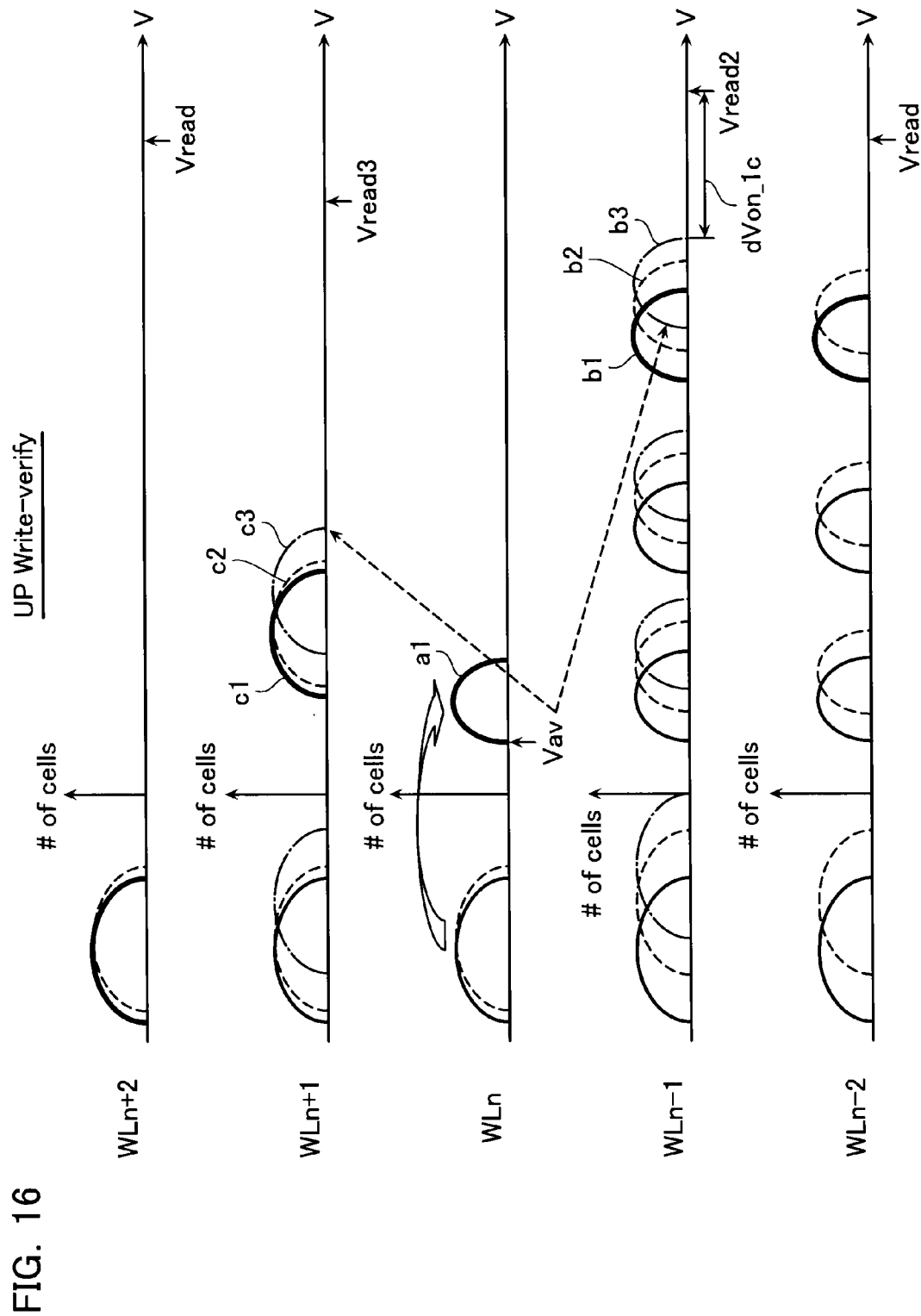
FIG. 16 shows the threshold distribution at the upper page write-verify time in the third mode with reference to FIG. 6.
Figure 17:
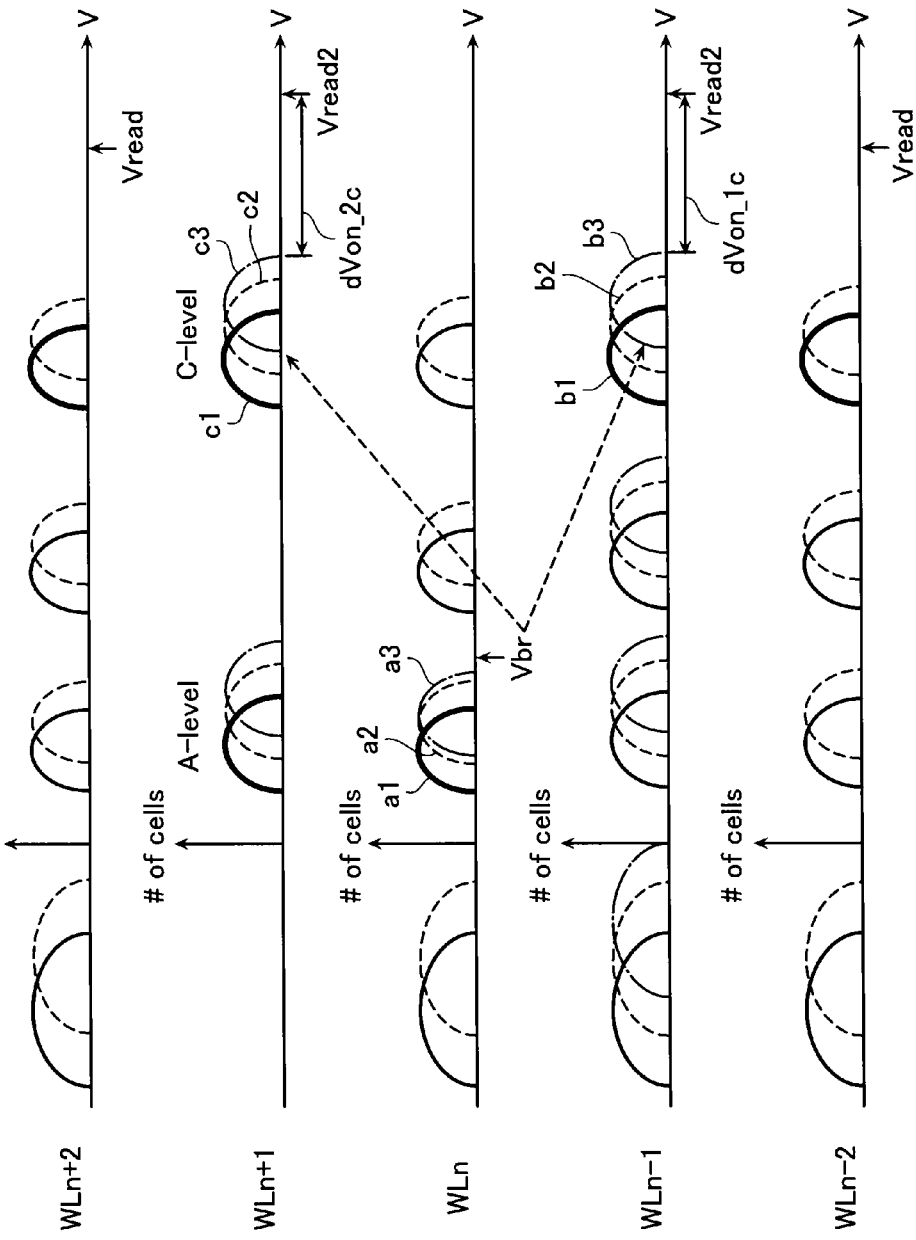
FIG. 17 shows the threshold distribution at the normal read time in the third mode in case written data in the adjacent and unselected cell is A- or C-level with reference to FIG. 7.
Figure 18:
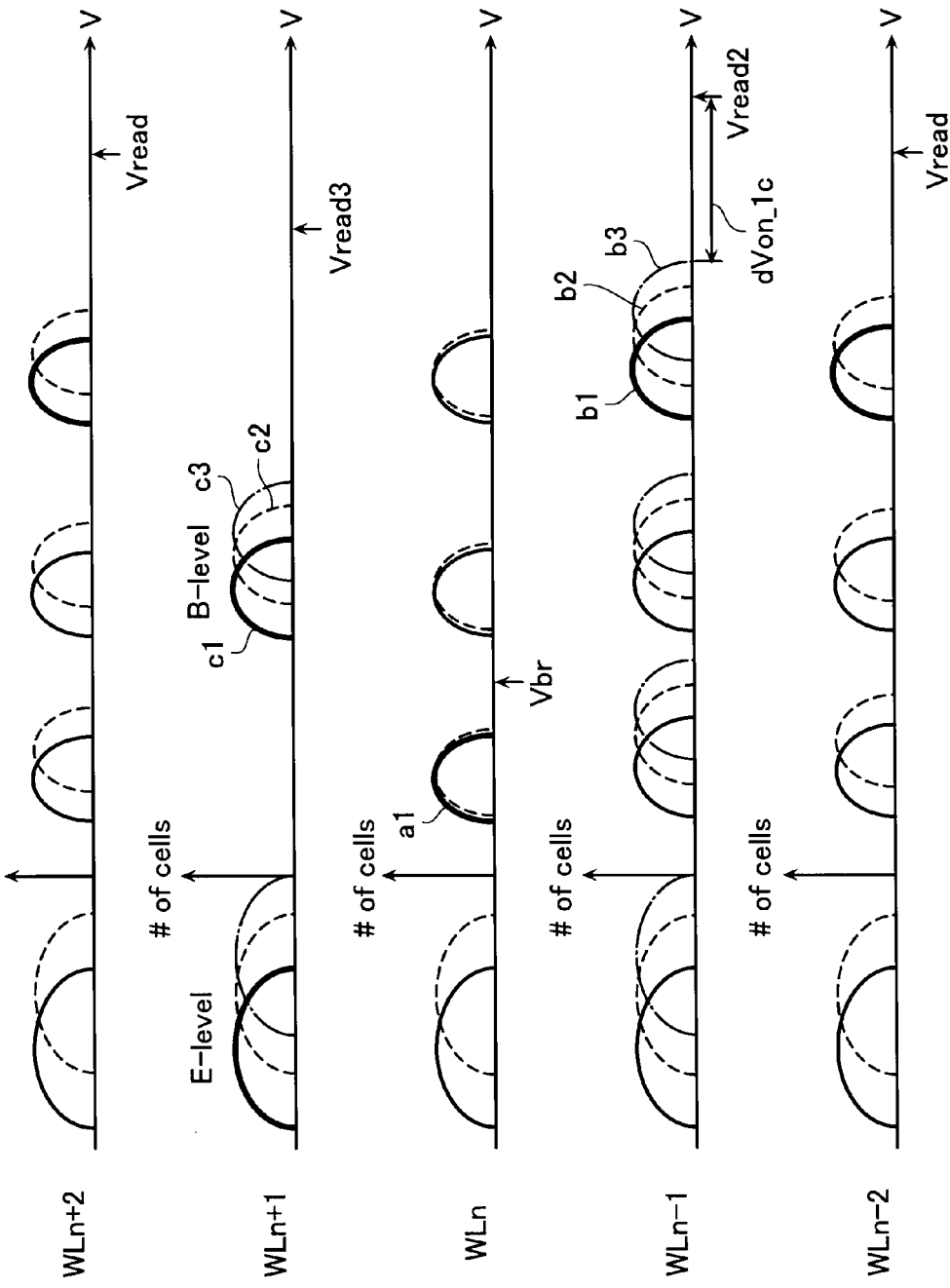
FIG. 18 shows the threshold distribution at the normal read time in the third mode in case written data in the adjacent and unselected cell is E- or B-level with reference to FIG. 7.

FIG. 16 shows cells' threshold states of word lines adjacent to a selected word line WLn at an upper page write-verify time of the selected word line WLn in comparison with those shown in FIGS. 6, 10 and 14. FIGS. 17 and 18 show the cell's threshold states of the selected word line WLn at a read time after writing all cells in comparison with those shown in FIGS. 7, 11 and 15, respectively.

Note here that FIG. 17 is a case that A- or C-level has been written into a cell on the unselected word line WLn+1 (i.e., such a case that the threshold shift amount due to the upper page writing is large); and FIG. 18 is another case that E- or B-level has been written into the cell on the unselected word line WLn+1 (i.e., such a case that the threshold shift amount due to the upper page writing is small).

As different from the second R/W scheme, applied to the adjacent and unselected word line WLn+1 on the bit line side is read pass voltage Vread3 lower than Vread applied to the remaining word lines. As similar to the second R/W scheme, applied to the adjacent and unselected word line WLn−1 on the source line side is read pass voltage Vread2 higher than Vread applied to the remaining word lines.

The cell under the adjacent and unselected word line WLn+1 on the bit line side is set in LM level at this stage, so that it may be obtained a sufficiently low on-resistance with Vread3 lower than Vread. Therefore, it is permitted to use such the pass voltage Vread3. The adjacent and unselected word line WNn−1 on the source line side being applied with Vread2, it becomes possible to secure a large on-margin dVon_1c in case of C-level cell.

By contrast, in the normal read operation for the selected word line WLn after having written all cells, the adjacent and unselected word line WLn+1 on the bit line side is applied with such a read pass voltage that is changed in accordance with cell data as follows.

That is, in case the cell data of word line WLn+1 is A- or C-level, as shown in FIG. 17, read pass voltage Vread2 higher than that of the verify time is used. As a result, it becomes possible to secure a large on-margin dVon_2c even if the data of the cell on the word line WLn+1 is C-level.

In case the cell data of word line WLn+1 is E- or B-level with a small threshold shift amount, as shown in FIG. 18, the same read pass voltage Vread3 as that of the verify time is used. As a result, it becomes possible to secure a large on-margin for the cell on the word line WLn+1.

To make the read condition for the selected word line after all data have been written different in accordance with the write data in the adjacent and unselected word line WLn+1, it is required to refer to the data of the word line WLn+1 when word line WLn is selected. For this purpose, perform data read of word line WLn+1 prior to data read of word line WLn, and store the data in the sense amplifier/data latch. For example, cell data of word line WLn+1 is A- or C-level, reference data "0" is latched while cell data is E- or B-level, reference data "1" is latched.

Data read for the word line WLn is performed with two cycles with conditions shown in FIGS. 17 and 18, and it will be judged for each bit line as follows: in case the reference data held in the sense amplifier/data latch is "1", data read with the condition of FIG. 17 is selected to be effective while the reference data is "0", data read with the condition of FIG. 18 is selected to be effective.

The correcting read operation in this embodiment in accordance with the adjacent cell's data will be explained in detail with reference to FIGS. 19 and 20.

Figure 19:
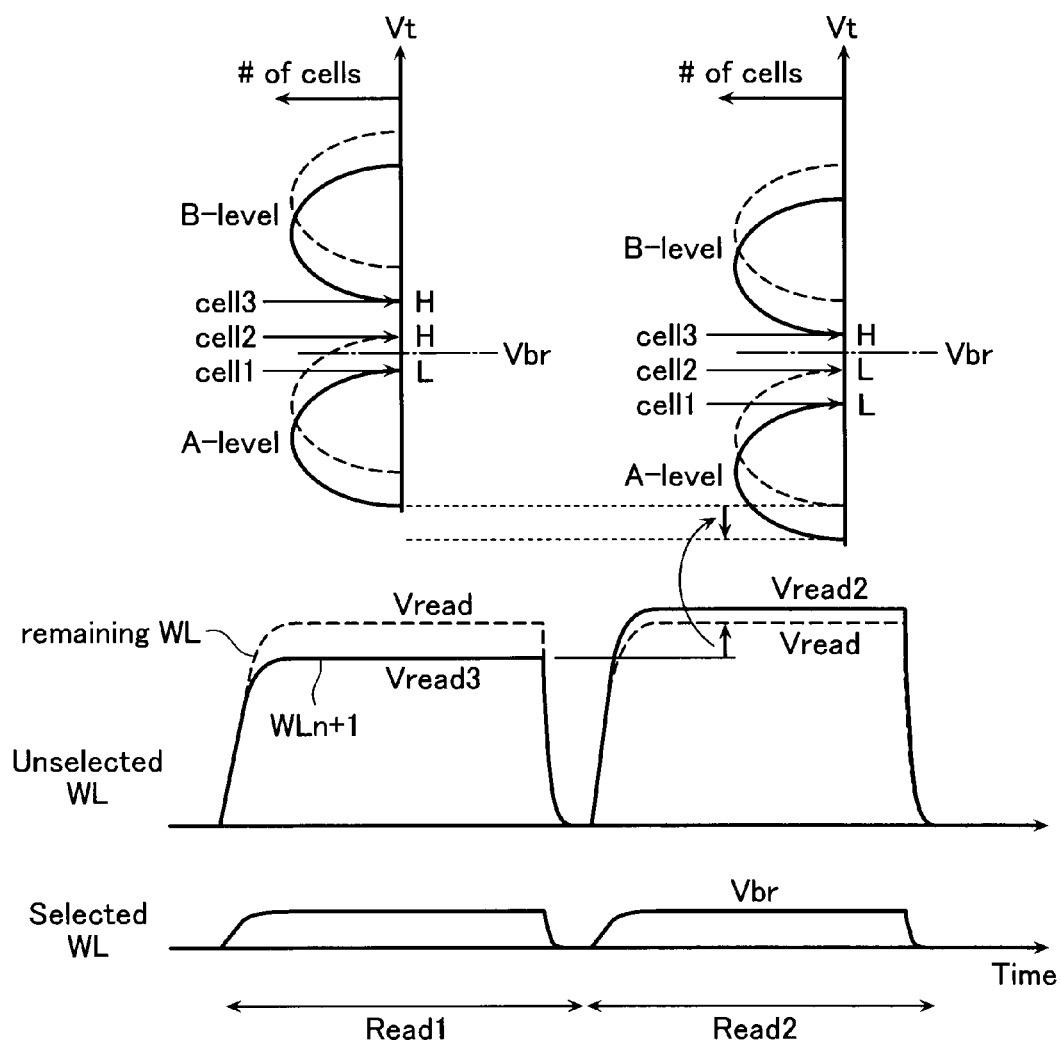
FIG. 19 is a diagram for explaining the correction read operation in the third mode.

FIG. 19 shows the word line voltages at two read cycles, Read1 and Read2, and how cells cell1~cell3 are corrected and read with respect to data level A and B to be distinguished by the lower page read with read voltage Vbr. The dotted lines of data A-level and B-level designate that these appear to be higher in threshold due to the interference between cells.

"cell1" is a memory cell to be read as an on-cell, which is not influenced by the interference between cells. "cell2" is a memory cell, the threshold voltage of which is shifted due to the interference between cells, and it is corrected in the read operation to be read as an on-cell (cell on the lower side). "cell3" is a memory cell, the threshold voltage of which is higher than those of "cell1" and "cell2".

In the write-verify operation, the selected voltage Vsel applied to the selected word line WLn is the verifying voltage while pass voltage Vread3 (<Vread) is applied to the unselected word line WLn+1.

In this embodiment, prior to starting the read operation for the selected word line WLn, data of the unselected word line WLn+1 is read and stored. This is performed automatically by the controller when word line WLn is selected in the read operation. In this read operation of the unselected word line WLn+1, in case E-level or B-level is judged, "H" is set at node PDC while A-level or C-level is judged, "L" is set at the node PDC. The sense unit has a certain number of data nodes and an arithmetic processing function, the above-described data read may be easily performed. The detailed explanation is omitted.

Next, the read operation for the selected word line WLn will be explained as follows: in the lower page read operation, as shown in FIG. 19, read operation Read1 and read operation Read2 are successively performed. In the read operation Read1, selected voltage applied to the selected word line WLn is set at Vbr, that is used for distinguishing A-level from B-level, and pass voltage Vread3 (<Vread) is applied to the unselected word line WLn+1. In the read operation Read2, the selected word line WLn is applied with the same read voltage Vbr while the unselected word line WLn+1 is applied with pass voltage Vread.

In the case of threshold distributions and data bit assignment shown in FIG. 4, it is able to judge the lower page (LP) data only with the read operation with the read voltage Vbr applied to the selected word line WLn.

In case the adjacent cell's data on the word line WLn+1 is E- or B-level, the interference from the adjacent cell to the selected cell is small, the threshold voltage of the selected cell on the word line WLn is hardly changed from the writeverified state. Therefore, in case the adjacent cell is in this state, data will be obtained in the read operation Read1 with the pass voltage of word line WLn+1 set at Vread3, that is the same as one at the write-verify time.

By contrast, in case the adjacent cell's data on the word line WLn+1 is A- or C-level, the threshold voltage of the selected cell appears to be increased due to the interference between floating gates FG. Therefore, in the read operation Read2, the pass voltage of the word line WLn+1 is set at Vread2 higher than Vread3, so that the interference effect will be cancelled.

It has already been provided the idea for canceling the interference effect of the floating gate type of memory cells with selection of the read condition of the selected cell (e.g., refer to U.S. Pat. No. 5,867,429, or JP-A-2004-32866). However, this idea is for adjusting the read condition of the selected cell itself influenced by the interference effect between floating gates, and the variations of the interference effects within the memory cells are not considered.

By contrast, in this embodiment, the read pass voltage applied to the adjacent and unselected word line WLn+1 is selected in accordance with data written state in the unselected cell, thereby canceling the interference between cells. The operation principle will be explained in detail below.

The interference effect between cells described here is defined as follows: when writing an adjacent cell after writing a noticed cell, FG potential of the adjacent cell is reduced to be lower than that of the selected cell, thereby resulting in that FG potential of the noticed cell also is reduced due to capacitive coupling, and the threshold voltage of the noticed cell appears to be high. This is an interference effect obtained via the coupling capacitance C3 shown in FIG. 8.

Therefore, in case the adjacent cell is written, it is desired to restore the FG potential of the adjacent cell in accordance with the written level into the same state as that obtained when the noticed cell is written. However, when the adjacent word line is changed in potential to achieve this, such interference will be obtained that the noticed cell is directly influenced from the adjacent word line via coupling capacitance C4 shown in FIG. 8.

In this embodiment, in consideration of the both of an interference function based on the serial-connected capacitance, C2+C3, of the adjacent cells and another interference function based on the coupling capacitance C4, the read operation is corrected. As a result, it becomes possible to strongly reduce the variations. This point will be explained in detail below.

When the adjacent and unselected word line WLn+1 is changed in potential by $\Delta Vwl$, the threshold voltage change $\Delta Vt$ is obtained as expressed in the following expression Exp. 2 obtained by transforming the above-described Exp. 1.

$$\Delta Vwl = \{C2/(C4+C3 \cdot Cr)\} \Delta Vt \quad [\text{Exp. 2}]$$

In Exp. 2, $\Delta Vt$ is the threshold voltage change amount due to the interference effect. Rewriting it into another threshold shift amount $\Delta Vt\_swing$ due to data writing in the adjacent and unselected cell, the following Exp. 3 is obtained.

$$\Delta Vwl = \{C2/(C4+C3 \cdot Cr)\} \Delta Vt\_swing \quad [\text{Exp. 3}]$$

A detailed numerous example is as follows. Assuming that the coefficient of $\Delta Vt\_swing$ is defined as: $C3 \cdot Cr/(C4+C3 \cdot Cr)=0.41$; and assuming that $\Delta Vt\_swing$ is about 3V as defined by the cell data change from E-level to A-level, $\Delta Vwl=1.24V$ is obtained.

As explained above, increasing the potential of word line WLn+1 by 1.24V, it becomes possible to cancel the interference effect due to the threshold shift amount, 3V, of the adjacent cell.

Further, to make the influence of the back pattern noise on the word line WLn+1 due to the selected word line WLn, as explained with reference to FIG. 7, less, the interference effect between FGs will be cancelled by use of the potential difference between Vread2 and Vread3. Additionally, the relationship of Vread2>vread suppresses the influence of that the back pattern noise increases between adjacent cells due to the selected word line voltage.

A setting example of pass voltage Vread2 is as follows. Since, as shown in the calculation example, the threshold voltage of the adjacent cell appears to be shifted with an order of 0.3V or 0.6V, keeping constant the difference between Vread2 and Vread3, Vread2 should be set at a voltage higher than Vread by 0.3V or 0.6V.

Figure 20:
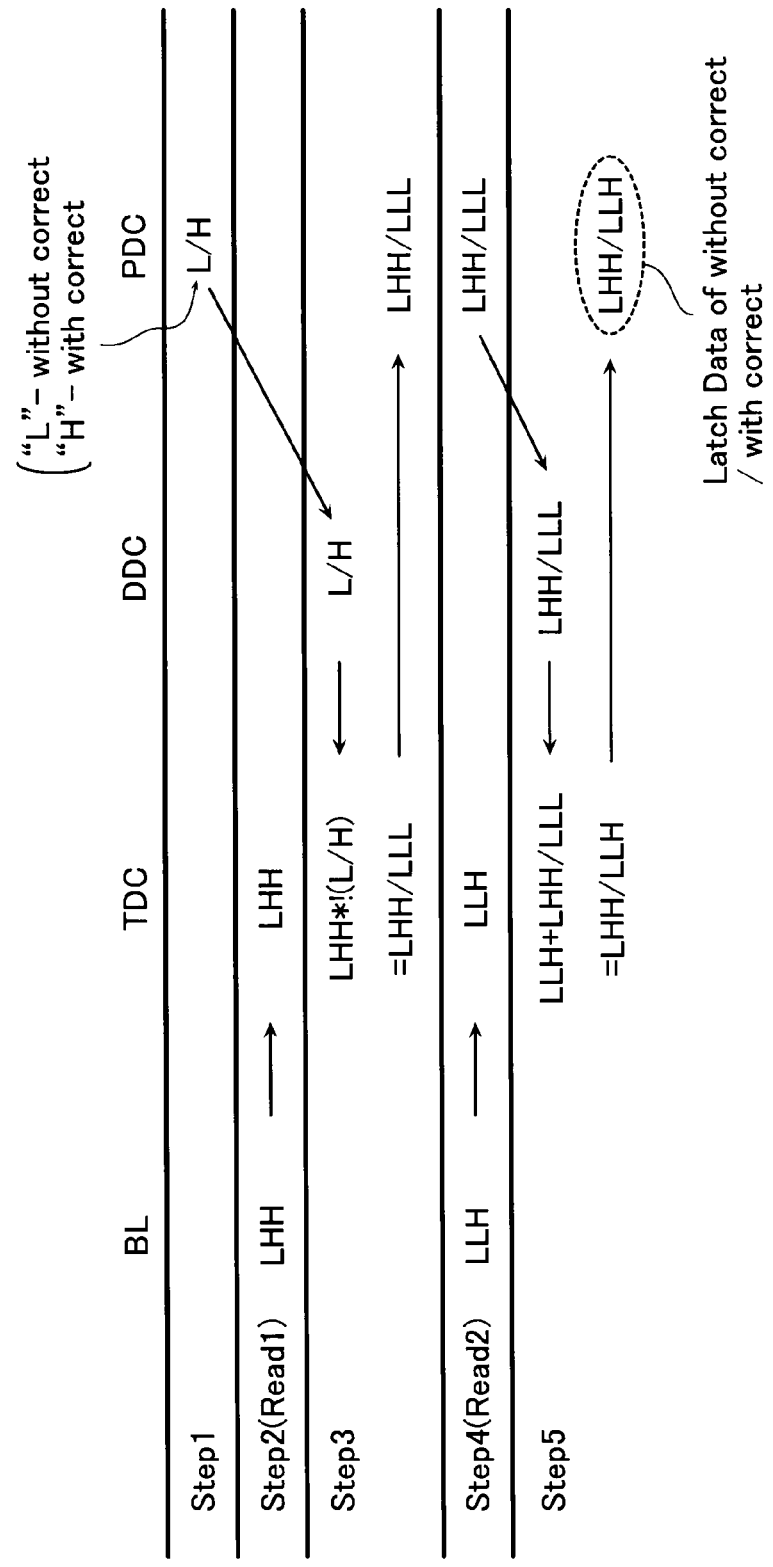
FIG. 20 is a diagram for explaining the data processing the correction read operation in the third mode.

FIG. 20 shows a data processing example, in which data threshold is corrected and read in accordance with the above-described principle, with steps, Step1~Step5, and the data changes at the respective nodes. In FIG. 20, data corresponding to three cell states (cell1, cell2, cell3) are expressed by the form of (L, L, H).

At Step1, prior to the read operation of the selected word line WLn, data read for correcting data is performed for word line WLn+1, and read data is latched at node PDC. At Step2, Read1 shown in FIG. 19 is performed, the bit line potential affected with cell data is temporally held at node TDC. The bit line potential at Step2 is shown as LHH. This designates the following situations: threshold of "cell1" is lower than Vbr, and the bit line is discharged to be low (L); threshold of "cell2" is higher than Vbr, and the bit line becomes high (H); and threshold of "cell3" is higher than Vbr, and the bit line becomes high (H).

At Step3, data at node PDC is transferred to node DDC, and the product of data at TDC by inverted data at DDC is obtained. This is achieved in the operation circuit 34 in the sense amplifier shown in FIG. 3 in such a way that VPRE is set to be 0V, and transistor 34 is turned on by REG="H".

That is, if DDC="H", TDC is discharged to be "L". If DDC="l", TDC is not discharged, and keeps the last data level as it is. This operation result is transferred to and held at node PDC.

At Step4, this being read step, Read2, shown in FIG. 19, the bit line potential is stored in node TDC. At this time, pass voltage of the adjacent and unselected word line WLn+1 is set at Vread2. Therefore, as shown in FIG. 19, the threshold voltages of cell1~cell3 appear to be lowered. The amounts of the threshold reduction correspond to the interference effects between cells to be cancelled.

Therefore, the threshold of "cell2" in Read1 and that of "cell1" in Read2 become substantially equal to each other. Latched data of (cell1, cell2, cell3) at node TDC are (L, L, H).

Next, at Step5, data previously latched at node PDC is transferred to node DDC, and addition operation of data at node TDC and data at node DDC is performed at node TDC. Explaining in detail, in the operation circuit 34 in FIG. 3, Vdd+Vtn (Vtn is threshold voltage of an NMOS transistor) is applied to REG; and VPRE is raised up to Vdd from 0V.

As a result, if DDC="H", TDC is forced to be "H" due to bootstrap. If DDC="L", the last TDC data will be kept as it is. The operation result at TDC is transferred to node PDC, and latched as the lower page data.

Therefore, according to this operation, in case "L" is initially stored at node PDC in the sense amplifier, finally latched data at the node PDC is read data in Read1 while in case "H" is initially stored at node PDC, read data in Read2 is finally latched at the node PDC.

As described above, data read with threshold correction may be performed for the respective bit lines, i.e., for the respective selected cells, which are coupled to a selected word line to be simultaneously read.

The sense amplifier configuration and the operational function are not limited to those shown in FIG. 3, and may be achieved with other circuit configurations. What is shown in this embodiment is: sensed data in a case where unselected word line WLn+1 is low and in another case where WLn+1 is high may be selected for each bit in a continuous read operation.

As another embodying mode in this embodiment, it is possible to correct the interference effect between cells at multiple steps, i.e., two or more steps. This is, for example, achieved by disposing another operational circuit between node N1 (PDC) and TDC in the sense amplifier shown in FIG. 3. Further, disposing one or more latch circuits in addition to latches L1 and L2, additional operational functions will be achieved.

Fourth R/W Scheme in the Embodiment

So far, it has been explained such a case that the write order is selected to make the interference between adjacent cells as small as possible. By contrast, in case word lines are selected in order from the source line side, and the lower page write and the upper page write are completed for each selected word line, each cell's threshold will be shifted due to the interference between adjacent cells after writing.

However, in the above-described case, precisely controlling the read pass voltage applied to the unselected word lines WLn+1 disposed adjacent to the selected word line WLn on the bit line side in accordance with cell data, the influence of the interference between cells will be reduced.

In detail, as similar to the third R/W scheme explained above, the read pass voltage of the adjacent and unselected word line at a write-verify time is set to be lower than the read pass voltage, Vread, applied to the remaining unselected word lines. After data writing for WLn+1, the read pass voltage applied to the unselected word line WLn+1 at a read time for the selected word line WLn is optimized in accordance with which level is cell data in E, A, B and C levels.

As a result, the influence of the interference between cells will be reduced.

In the third R/W scheme, the read pass voltage applied to the unselected word line WLn−1 is set to be Vread2 higher than Vread. According to the explanation for the first R/W scheme, it is not necessary to set the unselected word line WLn−1 at Vread2. Using Vread in place of Vread2, it will be expected the same operation and effect as described above.

In the above-described embodiment, the operation control example has been explained for a four-level data storage scheme (i.e., 2 bits/cell). However, this invention is in a method for controlling a unselected word line disposed adjacent to a selected word line, and is not limited to the four-level storage scheme. That is, this invention may be adapted to other memory devices of a binary data storage scheme (1 bit/cell), an eight-level storage scheme (3 bits/cell) and other multi-level data storage schemes.

Application Devices

As an embodiment, an electric card using the non-volatile semiconductor memory devices according to the above-described embodiment of the present invention and an electric device using the card will be described bellow.

Figure 21:
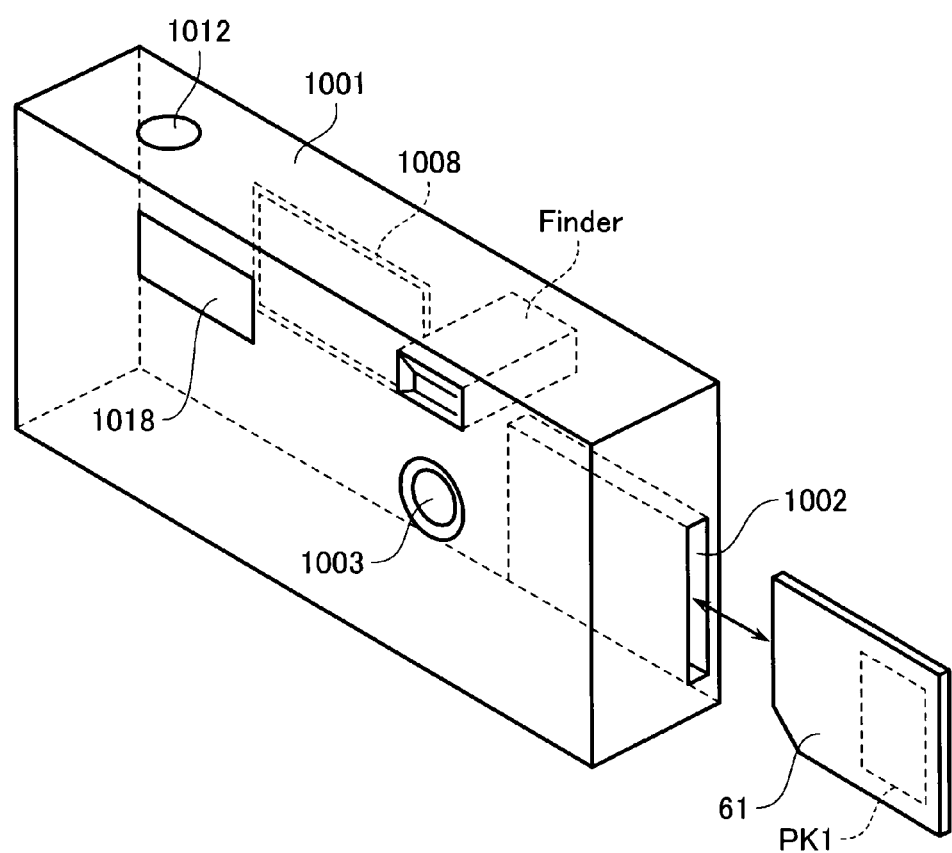
FIG. 21 shows another embodiment applied to a digital still camera.

FIG. 21 shows an electric card according to this embodiment and an arrangement of an electric device using this card. This electric device is a digital still camera 1001 as an example of portable electric devices. The electric card is a memory card 61 used as a recording medium of the digital still camera 1001. The memory card 61 incorporates an IC package PK1 in which the non-volatile semiconductor memory device or the memory system according to the above-described embodiments is integrated or encapsulated.

The case of the digital still camera 1001 accommodates a card slot 1002 and a circuit board (not shown) connected to this card slot 1002. The memory card 61 is detachably inserted in the card slot 1002 of the digital still camera 1001. When inserted in the slot 1002, the memory card 61 is electrically connected to electric circuits of the circuit board.

If this electric card is a non-contact type IC card, it is electrically connected to the electric circuits on the circuit board by radio signals when inserted in or approached to the card slot 1002.

Figure 22:
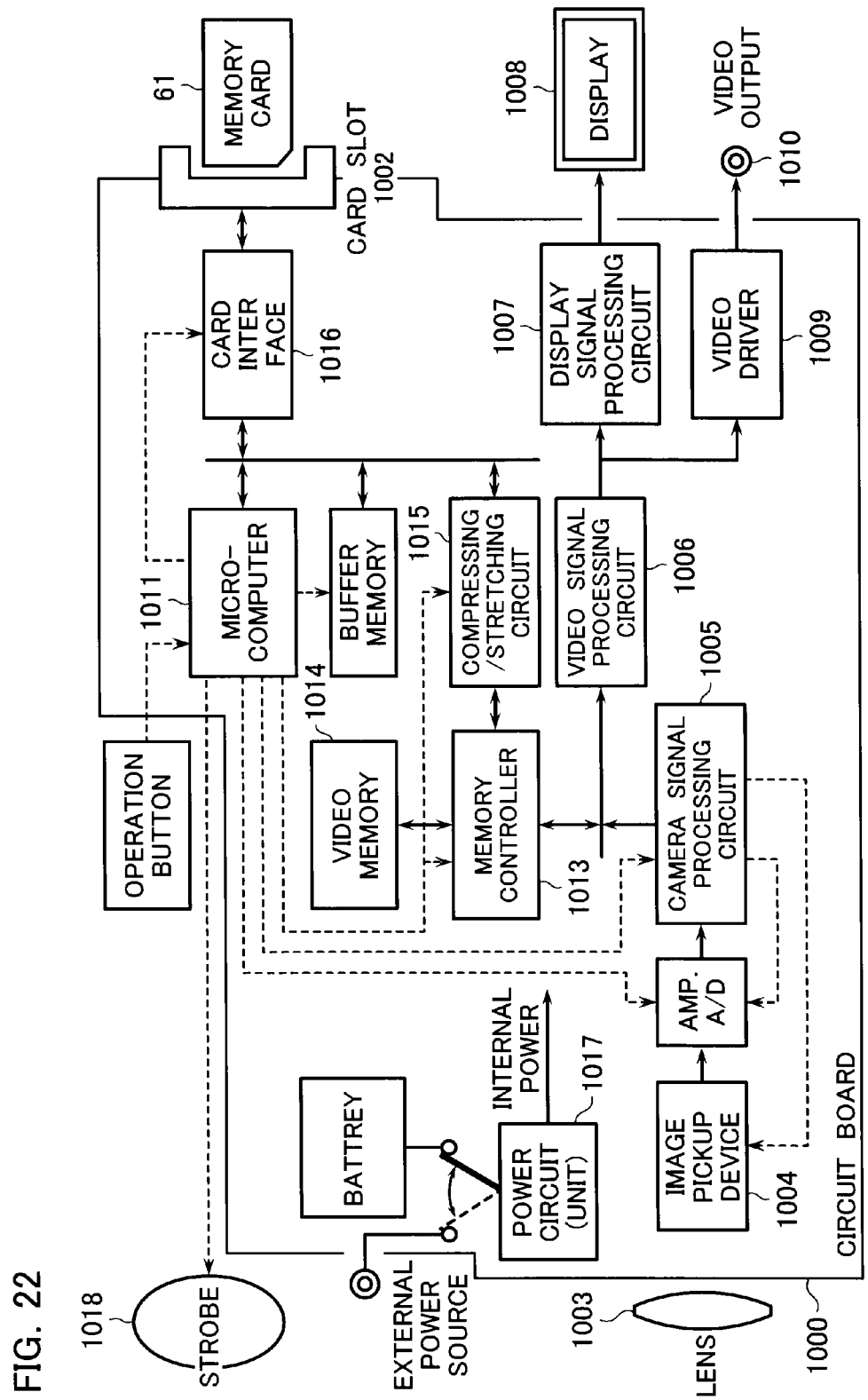
FIG. 22 shows the internal configuration of the digital still camera.
Figure 23A:
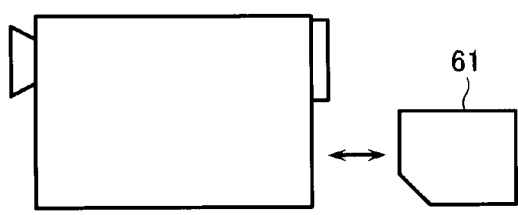
FIGS. 23A to 23J show other electric devices to which the embodiment is applied.
Figure 23F:
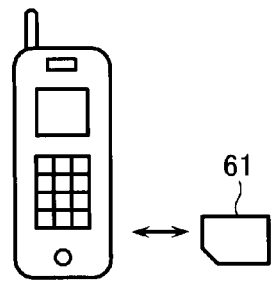
Figure 23B:
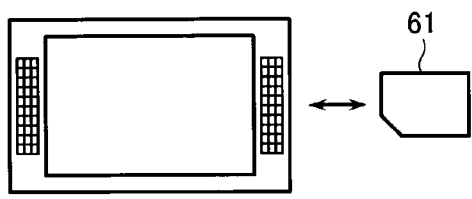
Figure 23G:
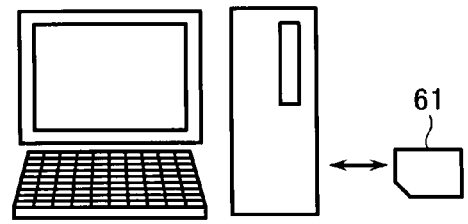
Figure 23C:
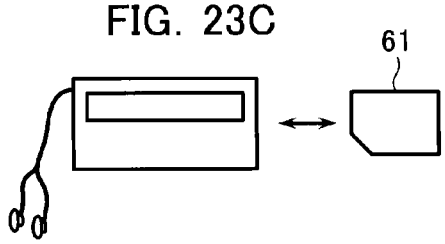
Figure 23H:
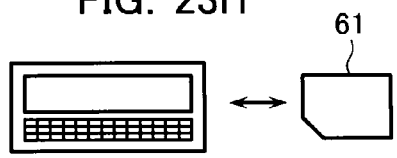
Figure 23D:
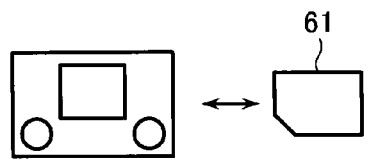
Figure 23I:
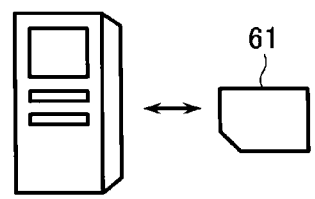
Figure 23E:
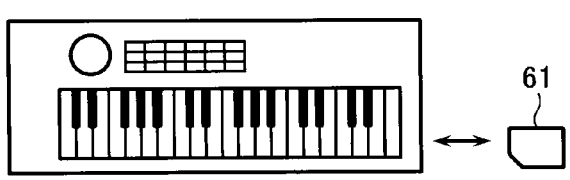
Figure 23J:
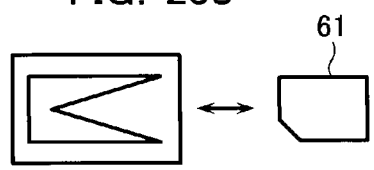

FIG. 22 shows a basic arrangement of the digital still camera. Light from an object is converged by a lens 1003 and input to an image pickup device 1004. The image pickup device 1004 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 1005 where the signal is subjected to automatic exposure control (AE), automatic white balance control (AWB), color separation, and the like, and converted into a luminance signal and color difference signals.

To monitor the image, the output signal from the camera processing circuit 1005 is input to a video signal processing circuit 1006 and converted into a video signal. The system of the video signal is, e.g., NTSC (National Television System Committee). The video signal is input to a display 1008 attached to the digital still camera 1001 via a display signal processing circuit 1007. The display 1008 is, e.g., a liquid crystal monitor.

The video signal is supplied to a video output terminal 1010 via a video driver 1009. An image picked up by the digital still camera 1001 can be output to an image apparatus such as a television set via the video output terminal 1010. This allows the pickup image to be displayed on an image apparatus other than the display 1008. A microcomputer 1011 controls the image pickup device 1004, analog amplifier (AMP), A/D converter (A/D), and camera signal processing circuit 1005.

To capture an image, an operator presses an operation button such as a shutter button 1012. In response to this, the microcomputer 1011 controls a memory controller 1013 to write the output signal from the camera signal processing circuit 1005 into a video memory 1014 as a flame image. The flame image written in the video memory 1014 is compressed on the basis of a predetermined compression format by a compressing/stretching circuit 1015. The compressed image is recorded, via a card interface 1016, on the memory card 61 inserted in the card slot.

To reproduce a recorded image, an image recorded on the memory card 61 is read out via the card interface 1016, stretched by the compressing/stretching circuit 1015, and written into the video memory 1014. The written image is input to the video signal processing circuit 1006 and displayed on the display 1008 or another image apparatus in the same manner as when image is monitored.

In this arrangement, mounted on the circuit board 1000 are the card slot 1002, image pickup device 1004, analog amplifier (AMP), A/D converter (A/D), camera signal processing circuit 1005, video signal processing circuit 1006, display signal processing circuit 1007, video driver 1009, microcomputer 1011, memory controller 1013, video memory 1014, compressing/stretching circuit 1015, and card interface 1016.

The card slot 1002 need not be mounted on the circuit board 1000, and can also be connected to the circuit board 1000 by a connector cable or the like.

A power circuit 1017 is also mounted on the circuit board 1000. The power circuit 1017 receives power from an external power source or battery and generates an internal power source voltage used inside the digital still camera 1001. For example, a DC-DC converter can be used as the power circuit 1017. The internal power source voltage is supplied to the respective circuits described above, and to a strobe 1018 and the display 1008.

As described above, the electric card according to this embodiment can be used in portable electric devices such as the digital still camera explained above. However, the electric card can also be used in various apparatus such as shown in FIGS. 23A to 23J, as well as in portable electric devices. That is, the electric card can also be used in a video camera shown in FIG. 23A, a television set shown in FIG. 23B, an audio apparatus shown in FIG. 23C, a game apparatus shown in FIG. 23D, an electric musical instrument shown in FIG. 23E, a cell phone shown in FIG. 23F, a personal computer shown in FIG. 23G, a personal digital assistant (PDA) shown in FIG. 23H, a voice recorder shown in FIG. 23I, and a PC card shown in FIG. 23J.

This invention is not limited to the above-described embodiments. It will be understood by those skilled in the art that various changes in form and detail may be made without departing from the spirit, scope, and teaching of the invention.

What is claimed is:

1. A method for controlling a non-volatile semiconductor memory device having a NAND string, in which multiple memory cells are connected in series, comprising:
a read procedure performed for a selected memory cell in the NAND string on the condition that the selected memory cell is applied with a selected voltage while unselected memory cells are driven to be turned on without regard to cell data thereof, wherein
a first read pass voltage and a second read pass voltage higher than the first read pass voltage are generated by a voltage generation circuit, and wherein
the first read pass voltage generated by the voltage generation circuit is applied to unselected memory cells except adjacent and unselected memory cells disposed adjacent to the selected memory cell, and the second read pass voltage generated by the voltage generation circuit is applied to at least one of the adjacent and unselected memory cells in the read procedure.

2. The method according to claim 1, wherein
the second read pass voltage is applied to the adjacent and unselected memory cell being completed in data write later than the selected memory cell.

3. The method according to claim 1, wherein
the read procedure is a normal read procedure for reading data of the selected memory cell after data writing.

4. The method according to claim 1, wherein
the read procedure is a write-verify read procedure for verify-reading data of the selected memory cell in a data write mode.

5. The method according to claim 3, wherein
in the normal read procedure, the second read pass voltage is applied to one cell in two adjacent and unselected memory cells disposed adjacent to the selected memory cell, the one cell having been written previously to the selected memory cell; and a third pass voltage is applied to the other cell in the two adjacent and unselected memory cells, the other cell having been written later than the selected memory cell, the third read pass voltage being selected in level in accordance with the cell's threshold shift amount.

6. The method according to claim 5, wherein
the third read pass voltage is set to be lower than the first read pass voltage in case the cell's threshold shift amount is less than a certain level while the third read pass voltage is set to be equal to the second read pass voltage in case the cell's threshold shift amount is greater than the certain level.

7. The method according to claim 5, wherein
the normal read procedure includes:
a first read operation performed for reading data of the other cell previously to reading data of the selected memory cell when it is selected; and
a second read operation performed for reading data of the selected memory cell on the condition that the third read pass voltage is selected in level with reference to the read data of the first read operation.

8. The method according to claim 1, wherein
the memory cell stores four-level data defined by data level E, A, B and C (where, E<A<B<C), data level E being defined as an erase state with a negative cell threshold while data levels A, B and C are defined as write states with positive cell threshold voltages, and
a data write procedure includes: a lower page write mode for selectively writing the memory cells with data level E to have a medium level LM set between data level A and B; and an upper page write mode for selectively writing the memory cells with data level E and data level LM to have data level A and data level B or C, respectively, and
in the data write procedure, the memory cells in the NAND string are selected from a source line side in such an order that a first memory cell is written in a lower page write mode; a second memory cell adjacent to the first memory cell disposed adjacent to the first memory cell on a bit line side is written in the successive lower page write mode; and then the first memory cell is written in an upper page write mode.

9. A method for controlling a non-volatile semiconductor memory device having a NAND string, in which multiple memory cells are connected in series, comprising:
a write-verifying procedure performed for a selected memory cell in the NAND string on the condition that the selected memory cell is applied with a write-verifying voltage and unselected memory cells are driven to be turned on without regard to cell data thereof; and
a normal read procedure performed for a selected memory cell in the NAND string on the condition that the selected memory cell is applied with a read voltage and unselected memory cells are driven to be turned on without regard to cell data thereof, wherein
in the write-verifying procedure, a first read pass voltage is applied to unselected memory cells except two adjacent and unselected memory cells disposed adjacent to the selected memory cell; a second read pass voltage higher than the first read pass voltage is applied to one cell of the two adjacent and unselected memory cells, the one cell having been written previously to the selected memory cell; and a third read pass voltage lower than the first read pass voltage is applied to the other cell, which is written later than the selected memory cell, and
in the normal read procedure, the first read pass voltage is applied to the unselected memory cells except the two adjacent and unselected memory cells; the second read pass voltage higher than the first read pass voltage is applied to one cell of the two adjacent and unselected memory cells, the one cell having been written previously to the selected memory cell; and a fourth read pass voltage is applied to the other cell, which has been written later than the selected memory cell, the fourth read pass voltage being selected in level in accordance with the cell's threshold shift amount.

10. The method according to claim 9, wherein
the fourth read pass voltage is set to be lower than the first read pass voltage in case the cell's threshold shift amount is less than a certain level while the fourth read pass voltage is set to be equal to the second read pass voltage in case the cell's threshold shift amount is greater than the certain level.

11. The method according to claim 10, wherein
the normal read procedure includes:
a first read operation performed for reading data of the other cell previously to reading data of the selected memory cell when it is selected; and
a second read operation performed for reading data of the selected memory cell on the condition that the fourth read pass voltage is selected in level with reference to the read data of the first read operation.

12. The method according to claim 9, wherein
the memory cell stores four-level data defined by data level E, A, B and C (where, E<A<B<C), data level E being defined as an erase state with a negative cell threshold while data levels A, B and C are defined as write states with positive cell threshold voltages, and
a data write procedure includes: a lower page write mode for selectively writing the memory cells with data level E to have a medium level LM set between data level A and B; and an upper page write mode for selectively writing the memory cells with data level E and data level LM to have data level A and data level B or C, respectively, and
in the data write procedure, the memory cells in the NAND string are selected from a source line side in such an order that a first memory cell is written in a lower page write mode; a second memory cell adjacent to the first memory cell disposed adjacent to the first memory cell on a bit line side is written in a successive lower page write mode; and then the first memory cell is written in an upper page write mode.

13. A method for controlling a non-volatile semiconductor memory device having a NAND string, in which multiple memory cells are connected in series, comprising:
a write-verifying procedure performed for a selected memory cell in the NAND string on the condition that the selected memory cell is applied with a write-verifying voltage and unselected memory cells are driven to be turned on without regard to cell data thereof; and
a normal read procedure performed for a selected memory cell in the NAND string on the condition that the selected memory cell is applied with a read voltage and unselected memory cells are driven to be turned on without regard to cell data thereof, wherein
in the write-verifying procedure, a first read pass voltage is applied to unselected memory cells except adjacent and unselected memory cells adjacent to the selected memory cell; a second read pass voltage lower than the first read pass voltage is applied to one of the adjacent and unselected memory cells, which is written later than the selected memory cell, and
in the normal read procedure, the first read pass voltage is applied to the unselected memory cells except the adjacent and unselected memory cells disposed adjacent to the selected memory cell; a third read pass voltage is applied to one of the adjacent and unselected memory cells, which has been written later than the selected memory cell, the third read voltage being selected in level in accordance with the cell's threshold shift amount, the maximum vale of which is higher than the first read pass voltage.

14. The method according to claim 13, wherein
the memory cell stores four-level data defined by data level E, A, B and C (where, E<A<B<C), data level E being defined as an erase state with a negative cell threshold while data levels A, B and C are defined as write states with positive cell threshold voltages, and
a data write procedure includes: a lower page write mode for selectively writing the memory cells with data level E to have a medium level LM set between data level A and B; and an upper page write mode for selectively writing the memory cells with data level E and data level LM to have data level A and data level B or C, respectively, and
in the data write procedure, the memory cells in the NAND string are selected from a source line side in such an order that a first memory cell is written in a lower page write mode; a second memory cell adjacent to the first memory cell disposed adjacent to the first memory cell on a bit line side is written in a successive lower page write mode; and then the first memory cell is written in an upper page write mode.

15. A method for controlling a non-volatile semiconductor memory device having a NAND string, in which multiple memory cells are connected in series, comprising:
a write-verifying procedure performed for a selected memory cell in the NAND string on the condition that the selected memory cell is applied with a write-verifying voltage and unselected memory cells are driven to be turned on without regard to cell data thereof; and
a normal read procedure performed for a selected memory cell in the NAND string on the condition that the selected memory cell is applied with a read voltage and unselected memory cells are driven to be turned on without regard to cell data thereof, wherein
in the write-verifying procedure, a first read pass voltage is applied to unselected memory cells except adjacent and unselected memory cells adjacent to the selected memory cell; a second read pass voltage lower than the first read pass voltage is applied to one of the adjacent and unselected memory cells, which is written later than the selected memory cell, and
in the normal read procedure, the first read pass voltage is applied to the unselected memory cells except the adjacent and unselected memory cells disposed adjacent to the selected memory cell; a third read pass voltage is applied to one of the adjacent and unselected memory cells, which has been written later than the selected memory cell, the third read voltage being selected in level in accordance with the cell data, the maximum value of which is higher than the first read pass voltage.

16. The method according to claim 15, wherein
the memory cell stores multi-level data defined as a cell threshold voltage, and
in a data write procedure, the memory cells in the NAND strings are selected in order from a source line side, and the multi-level data writing are completed for each selected memory cell.

* * * * *